(12) United States Patent
Ogawa

(10) Patent No.: US 11,955,398 B2
(45) Date of Patent: Apr. 9, 2024

(54) SEMICONDUCTOR DEVICE

(71) Applicant: FUJI ELECTRIC CO., LTD., Kawasaki (JP)

(72) Inventor: Eri Ogawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 329 days.

(21) Appl. No.: 17/354,110

(22) Filed: Jun. 22, 2021

(65) Prior Publication Data
US 2022/0051961 A1    Feb. 17, 2022

(30) Foreign Application Priority Data

Aug. 12, 2020 (JP) ................ 2020-136408

(51) Int. Cl.
*H01L 25/18*  (2023.01)
*H01L 21/48*  (2006.01)
(Continued)

(52) U.S. Cl.
CPC .......... *H01L 23/34* (2013.01); *H01L 21/4817* (2013.01); *H01L 21/4871* (2013.01); *H01L 22/12* (2013.01); *H01L 23/043* (2013.01); *H01L 23/3735* (2013.01); *H01L 24/32* (2013.01); *H01L 24/40* (2013.01); *H01L 24/73* (2013.01); *H01L 25/072* (2013.01); *H01L 25/18* (2013.01); *H01L 2224/32225* (2013.01); *H01L 2224/40225* (2013.01); *H01L 2224/73263* (2013.01);
(Continued)

(58) Field of Classification Search
None
See application file for complete search history.

(56) References Cited

U.S. PATENT DOCUMENTS

2011/0310568 A1* 12/2011 Hong ................ H01L 23/647
                                                  257/E29.325
2015/0091551 A1*  4/2015 Kanschat ........... G01R 19/0092
                                                       29/610.1
(Continued)

FOREIGN PATENT DOCUMENTS

JP      10198440 A     7/1998
JP     2002305802 A    10/2002
(Continued)

*Primary Examiner* — Michelle Mandala
*Assistant Examiner* — Jordan M Klein

(57) ABSTRACT

A semiconductor device includes: an insulating circuit substrate; a semiconductor element including a first main electrode bonded to a first conductor layer of the insulating circuit substrate via a first bonding material, a semiconductor substrate deposited on the first main electrode, and a second main electrode deposited on the semiconductor substrate; and a resistive element including a bottom surface electrode bonded to a second conductor layer of the insulating circuit substrate via a second bonding material, a resistive layer with one end electrically connected to the bottom surface electrode, and a top surface electrode electrically connected to another end of the resistive layer, wherein the first main electrode includes a first bonded layer bonded to the first bonding material, the bottom surface electrode includes a second bonded layer bonded to the second bonding material, and the first bonded layer and the second bonded layer have a common structure.

14 Claims, 23 Drawing Sheets

(51) Int. Cl.
*H01L 21/66* (2006.01)
*H01L 23/00* (2006.01)
*H01L 23/043* (2006.01)
*H01L 23/34* (2006.01)
*H01L 23/373* (2006.01)
*H01L 25/07* (2006.01)

(52) U.S. Cl.
CPC ............. *H01L 2924/10253* (2013.01); *H01L 2924/10272* (2013.01); *H01L 2924/1033* (2013.01); *H01L 2924/1067* (2013.01); *H01L 2924/12036* (2013.01); *H01L 2924/1302* (2013.01); *H01L 2924/13032* (2013.01); *H01L 2924/13055* (2013.01); *H01L 2924/13091* (2013.01); *H01L 2924/15787* (2013.01); *H01L 2924/1715* (2013.01)

(56) References Cited

U.S. PATENT DOCUMENTS

| | | | | |
|---|---|---|---|---|
| 2015/0319877 | A1* | 11/2015 | Ohashi | H01L 24/83 361/728 |
| 2019/0181089 | A1* | 6/2019 | Karino | H01L 24/49 |
| 2020/0312729 | A1 | 10/2020 | Hoya | |

FOREIGN PATENT DOCUMENTS

| | | | |
|---|---|---|---|
| JP | 2002315383 | A | 10/2002 |
| JP | 2019106485 | A | 6/2019 |
| JP | 6562173 | B1 | 8/2019 |

* cited by examiner

US 11,955,398 B2

SEMICONDUCTOR DEVICE

CROSS-REFERENCE TO RELATED APPLICATION

This application claims benefit of priority under 35 USC 119 based on Japanese Patent Application No. 2020-136408 filed on Aug. 12, 2020, the entire contents of which are incorporated by reference herein.

BACKGROUND

1. Field of the Invention

The present invention relates to semiconductor devices, and more particularly, to a power semiconductor device (a semiconductor module) used as an electronic module or an industrial module.

2. Description of the Related Art

Power semiconductor devices such as inverter devices that convert direct current into alternating current include power semiconductor elements (simply referred to below as "semiconductor elements") as switching elements mounted on insulating circuit substrates. When a semiconductor element is made of silicon (Si), an on-chip sensor or a negative temperature coefficient (NTC) thermistor is typically used as a temperature sensor for detecting a circumferential temperature around the semiconductor element.

The on-chip sensor is implemented by a p-n junction diode provided on the semiconductor element. The on-chip sensor detects the temperature by use of the temperature characteristics of the p-n junction diode. The NTC thermistor is mounted on the insulating circuit substrate. The NTC thermistor also detects the temperature by use of the temperature characteristics of a material included in the NTC thermistor.

JP 2002-315383 A discloses that a temperature detector for a switching circuit is implemented by a temperature-sensitive resistive element. JP 2019-106485 A discloses a vertical resistive element including a resistive layer deposited on a semiconductor substrate. JP 6562173 B discloses that auxiliary source terminals connected to a plurality of transistor chips connected in parallel to serve as switching elements are used in common.

JP H10-198440 A discloses that a resistive element detects a temperature of a switching element.

JP 2002-305802 A discloses that a resistive element detects a temperature of a switching element.

The application of the on-chip sensor to the power semiconductor device is not practical in terms of manufacturing costs under the present circumstances when the semiconductor element made of silicon carbide (SiC) is mounted. The use of the NTC thermistor as a temperature sensor may cause a deterioration of a back-surface electrode of the NTC thermistor made by nickel (Ni) plating and tin (Sn) plating during a process of soldering the semiconductor element on the insulating circuit substrate by heat treatment under a hydrogen atmosphere.

SUMMARY

In view of the foregoing problems, the present invention provides a semiconductor device that can avoid a deterioration of a temperature sensor mounted on an insulating circuit substrate together with a semiconductor element.

An aspect of the present invention inheres in a semiconductor device including: an insulating circuit substrate; a semiconductor element including a first main electrode bonded to a top surface of a first conductor layer of the insulating circuit substrate via a first bonding material, a semiconductor substrate deposited on a top surface of the first main electrode, and a second main electrode deposited on a top surface of the semiconductor substrate; and a resistive element including a bottom surface electrode bonded to a top surface of a second conductor layer of the insulating circuit substrate via a second bonding material, a resistive layer with one end electrically connected to the bottom surface electrode, and a first top surface electrode electrically connected to another end of the resistive layer, wherein the first main electrode includes a first bonded layer bonded to the first bonding material, the bottom surface electrode includes a second bonded layer bonded to the second bonding material, and the first bonded layer and the second bonded layer have a common structure.

Another aspect of the present invention inheres in a semiconductor device including: an insulating circuit substrate; a semiconductor element including a first main electrode bonded to a top surface of a first conductor layer of the insulating circuit substrate via a first bonding material, a semiconductor substrate deposited on a top surface of the first main electrode, and a second main electrode deposited on a top surface of the semiconductor substrate; and a resistive element including a bottom surface electrode bonded to a top surface of a second conductor layer of the insulating circuit substrate via a second bonding material, a resistive layer with one end electrically connected to the bottom surface electrode, and a first top surface electrode electrically connected to another end of the resistive layer, wherein the second main electrode is electrically connected to an auxiliary source terminal, the first top surface electrode is electrically connected to a temperature detection terminal, and the bottom surface electrode is electrically connected to the auxiliary source terminal.

Further another aspect of the present invention inheres in a semiconductor device including: an insulating circuit substrate; a semiconductor element including a first main electrode bonded to a top surface of a first conductor layer of the insulating circuit substrate via a first bonding material, a semiconductor substrate deposited on a top surface of the first main electrode, and a second main electrode deposited on a top surface of the semiconductor substrate; and a resistive element including a bottom surface electrode bonded to a top surface of a second conductor layer of the insulating circuit substrate via a second bonding material, a resistive layer with one end electrically connected to the bottom surface electrode, and a first top surface electrode electrically connected to another end of the resistive layer, wherein the resistive element includes, in one chip, a diode with a cathode or an anode electrically connected to the bottom surface electrode, and a second top surface electrode electrically connected to the anode or the cathode of the diode.

DETAILED DESCRIPTION

Figure 1:
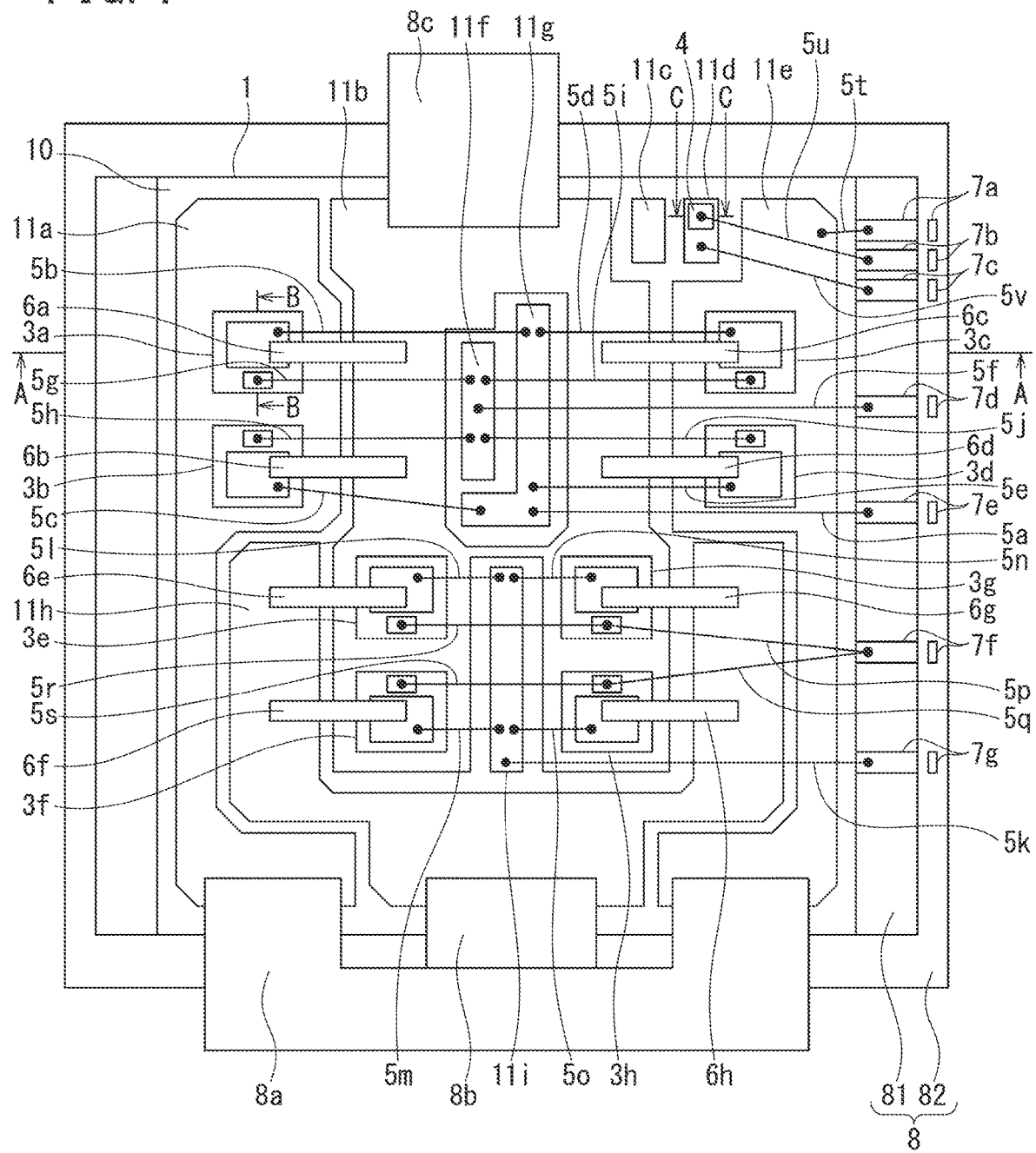
FIG. 1 is a plan view of a semiconductor device according to a first embodiment.

With reference to the Drawings, first and second embodiments of the present invention will be described below. In the Drawings, the same or similar elements are indicated by the same or similar reference numerals. The Drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the embodiment, a "first main electrode" is assigned to a source electrode or a drain electrode in a field-effect transistor (FET) or a static induction transistor (SIT). The first main electrode is assigned to an emitter electrode or a collector electrode in an insulated-gate bipolar transistor (IGBT). The first main electrode is assigned to an anode electrode or a cathode electrode in a static induction (SI) thyristor, a gate turn-off (GTO) thyristor or a diode. A "second main electrode" is assigned to an electrode which is not assigned as the first main electrode and will be the source electrode or the drain electrode in the FET or the SIT, the emitter electrode or the collector electrode in the IGBT, and the anode electrode or the cathode electrode in the SI thyristor, the GTO thyristor or the diode. That is, when the first main electrode is the source electrode, the second main electrode means the drain electrode. When the first main electrode is the emitter electrode, the second main electrode means the collector electrode. When the first main electrode is the anode electrode, the second main electrode means the cathode electrode.

Further, definitions of directions such as "top", "bottom", "up-and-down", "right", "left" of "right-and-left" in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. Furthermore, "top surface" and "bottom surface" may be referred to as "front side" and "back surface" respectively.

First Embodiment

A semiconductor device according to a first embodiment includes a case member 8, an insulating circuit substrate 1 arranged inside the case member 8, semiconductor elements (semiconductor chips) 3a to 3h as switching elements mounted on the insulating circuit substrate 1, and a resistive element (a resistive chip) 4 mounted on the insulating circuit substrate 1, as illustrated in FIG. 1. FIG. 1 schematically illustrates bonding points of bonding wires 5a to 5v as indicated by the black dots.

The semiconductor device according to the first embodiment is a 2-in-1 semiconductor module in which the semiconductor elements 3a to 3d implement an upper arm for one phase of a three-phase inverter circuit, and the semiconductor elements 3e to 3h implement a lower arm of the inverter circuit. The semiconductor device according to the first embodiment is not limited to the 2-in-1 semiconductor module, and may be a 1-in-1 semiconductor module, for example.

Figure 2:
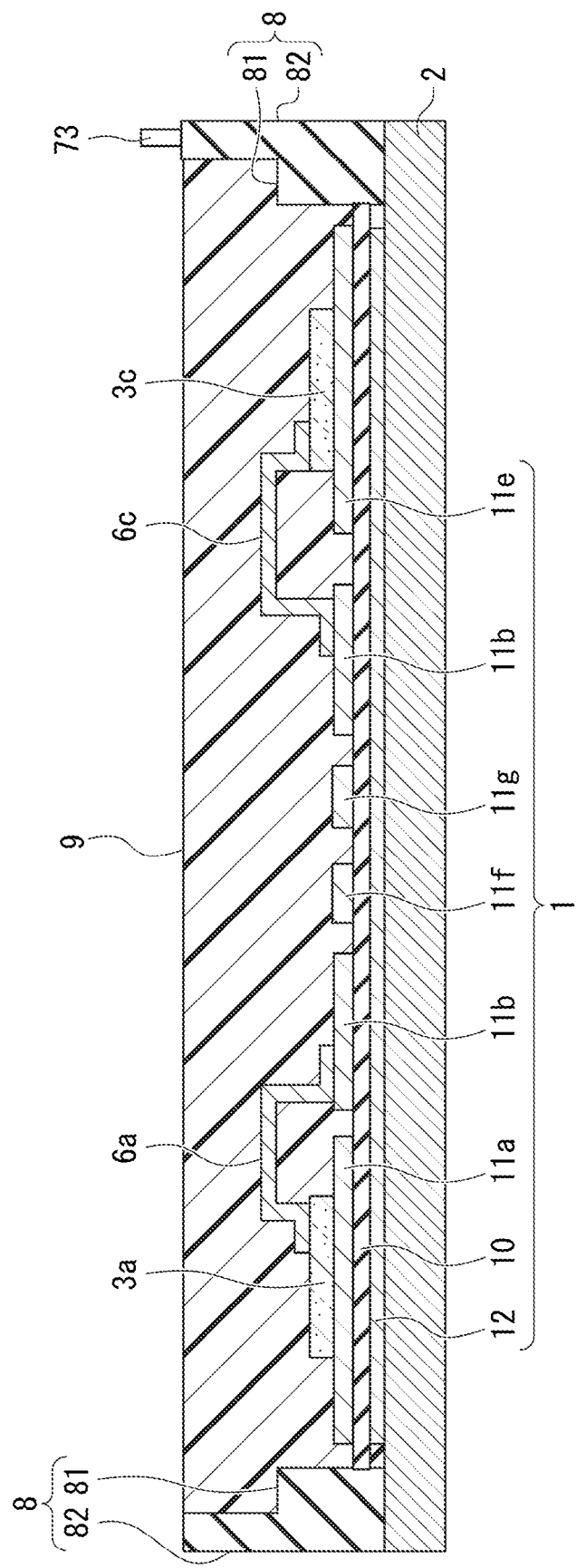
FIG. 2 is a cross-sectional view as viewed from direction A-A in FIG. 1.

FIG. 2 is a cross-sectional view as viewed from direction A-A that is a segment passing through the semiconductor elements 3a and 3c illustrated in FIG. 1. As illustrated in FIG. 1 and FIG. 2, the insulating circuit substrate 1 is a direct copper bonded (DCB) substrate or an active metal brazed (AMB) substrate, for example. The insulating circuit substrate 1 includes an insulating substrate 10, upper conductor layers (circuit layers) 11a to 11i deposited on the top surface of the insulating substrate 10, and a lower conductor layer (a radiation layer) 12 deposited on the bottom surface of the insulating substrate 10.

The insulating substrate 10 is a ceramic substrate made of aluminum oxide ($Al_2O_3$), aluminum nitride (AlN), silicon nitride ($Si_3N_4$), or boron nitride (BN), or a resin insulating substrate made of polymer material, for example. The upper conductor layers 11a to 11i and the lower conductor layer 12 are each a conductor foil made of copper (Cu) or aluminum (Al), for example. The planar pattern, the arranged positions, and the number of the upper conductor layers 11a to 11i are determined as appropriate.

A base plate (a radiation plate) 2 made of metal, for example, is deposited on the bottom surface of the lower conductor layer 12. The case member 8 made of resin, for example, is arranged on the top surface of the base plate 2 to surround the circumference of the insulating circuit substrate 1. The case member 8 includes a stepped part 81 and a side wall part 82 arranged on the outside of the stepped part 81.

As illustrated in FIG. 2, the semiconductor elements 3a to 3h are sealed with a sealing member 9 made of resin, for example. FIG. 1 omits the illustration of the sealing member 9. As illustrated in FIG. 1, the semiconductor element 3a and 3b are mounted on the upper conductor layer 11a of the insulating circuit substrate 1. The semiconductor elements 3c and 3d are mounted on the upper conductor layer 11e of the insulating circuit substrate 1. The semiconductor elements 3e and 3f are mounted on the upper conductor layer 11b of the insulating circuit substrate 1. The semiconductor elements 3g and 3h are mounted on the upper conductor layer 11b of the insulating circuit substrate 1.

The semiconductor elements 3a to 3h as used therein may be a field-effect transistor (FET), an insulated gate bipolar transistor (IGBT), a static induction (SI) thyristor, or a gate turn-off (GTO) thyristor, for example. The present embodiment is illustrated below with a case in which the semiconductor elements 3a to 3h are each a MOSFET. The arranged positions and the number of the semiconductor elements 3a to 3h are determined as appropriate.

Figure 3:
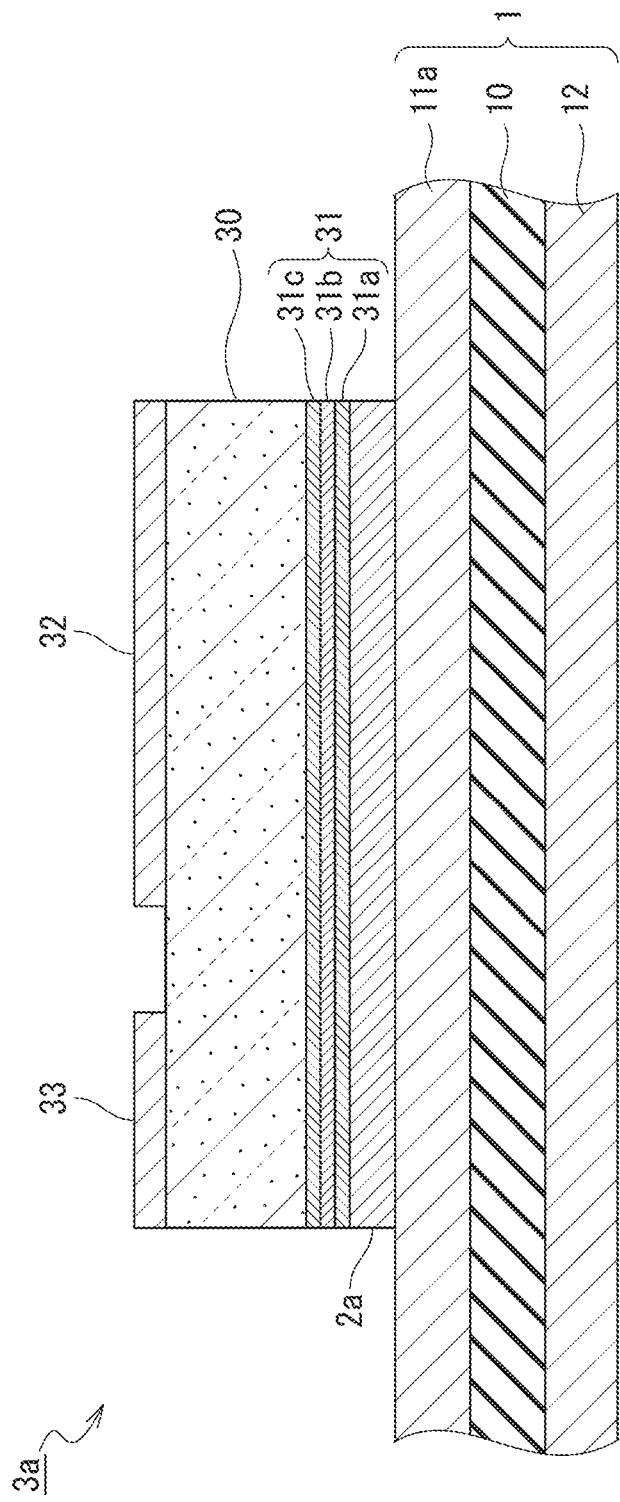
FIG. 3 is a cross-sectional view as viewed from direction B-B in FIG. 1.

FIG. 3 is a cross-sectional view as viewed from direction B-B that is a segment passing through the semiconductor element 3a illustrated in FIG. 1. FIG. 3 omits the illustration of the base plate 2 and the sealing member 9. As illustrated in FIG. 3, the semiconductor element 3a is bonded onto the upper conductor layer 11a of the insulating circuit substrate 1 via a bonding material 2a. The bonding material 2a is made of solder or sintered material, for example. The solder to be used may be tin-antimony (SnSb) based or tin-silver (SnAg) based solder, for example. The sintered material to be used may be silver (Ag) based or copper (Cu) based metallic particle paste (conductive paste), for example.

The semiconductor element 3a includes a semiconductor substrate 30, a first main electrode (a drain electrode) 31 arranged on the bottom surface side of the semiconductor substrate 30, and a second main electrode (a source electrode) 32 and a control electrode (a gate electrode) 33 arranged on the top surface side of the semiconductor substrate 30. The semiconductor substrate 30 is a compound semiconductor substrate of a wide bandgap semiconductor such as silicon carbide (SiC), gallium nitride (GaN), and gallium oxide ($Ga_2O_3$), for example. The semiconductor substrate 30 may be a silicon (Si) substrate instead.

The drain electrode 31 has a three-layer structure including a first electrode layer 31a bonded to the top surface of the bonding material 2a, a second electrode layer 31b arranged in contact with the top surface of the first electrode layer 31a, and a third electrode layer 31c arranged in contact with the top surface of the second electrode layer 31b and in contact with the bottom surface of the semiconductor substrate 30.

The first electrode layer 31a and the second electrode layer 31b compose a bonded layer. The first electrode layer 31a is made of gold (Au), for example. The second electrode layer 31b is made of nickel (Ni), for example. The second electrode layer 31b may be an alloy (Ni-p) layer mainly including Ni. The third electrode layer 31c serves as a barrier layer. The third electrode layer 31c is made of titanium (Ti), for example. The third electrode layer 31c may have a stacked structure including Ti and titanium nitride (TiN).

The respective semiconductor elements 3b to 3h illustrated in FIG. 1 are bonded onto the insulating circuit substrate 1 via a bonding material such as solder as in the case of the semiconductor element 3a illustrated in FIG. 3, and have a configuration similar to that of the semiconductor element 3a illustrated in FIG. 3.

Figure 4:
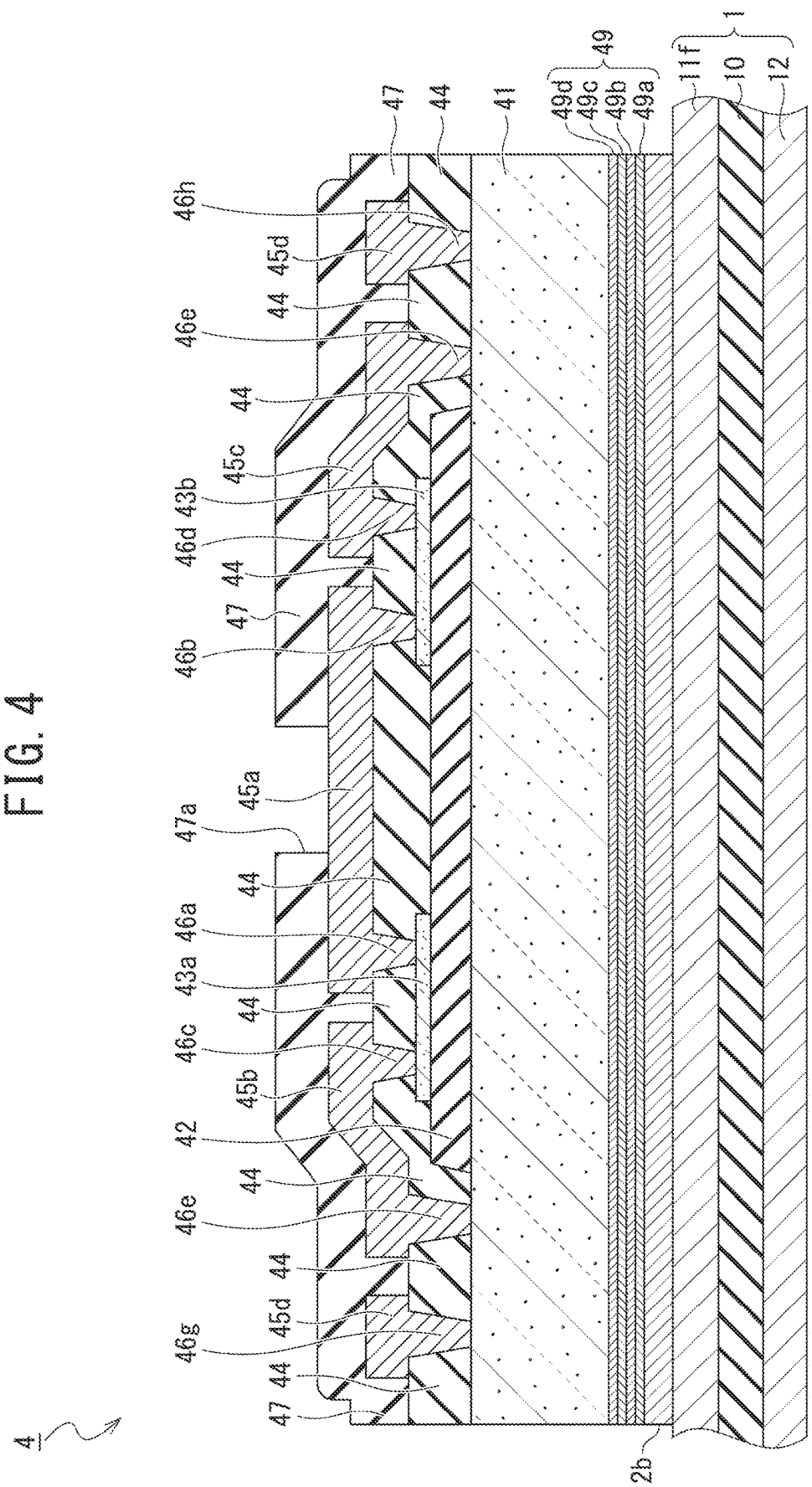
FIG. 4 is a cross-sectional view as viewed from direction C-C in FIG. 1.

The resistive element 4 illustrated in FIG. 1 is used as a temperature sensor for detecting a circumferential temperature around the semiconductor elements 3a to 3h. The resistive element 4 has a rectangular planar pattern, for example. FIG. 4 is a cross-sectional view as viewed from direction C-C that is a segment passing through the resistive element 4 illustrated in FIG. 1. FIG. 4 omits the illustration of the base plate 2 and the sealing member 9. As illustrated in FIG. 4, the resistive element 4 includes a semiconductor substrate 41 having low specific resistance, a first insulating film 42 deposited on the semiconductor substrate 41, and resistive layers 43a and 43b of thin films deposited on the first insulating film 42.

The semiconductor substrate 41 as used herein may be a substrate having a low specific resistance such as a silicon substrate doped with n-type impurity ions or p-type impurity ions at a high concentration. The amount of a resistive component in the semiconductor substrate 41 is preferably reduced to a level that can be ignored with respect to the resistive component of the resistive layers 43a and 43b. In particular, the resistive component of the semiconductor substrate 41 is preferably about 1/100 or lower of the resistive component of the resistive layers 43a and 43b. The specific resistance of the semiconductor substrate 41 may be set in a range of about 2 mΩ·cm to 60 mΩ·cm.

The first insulating film 42 as used herein may be a silicon oxide film (a $SiO_2$ film), a silicon nitride film (a $Si_3N_4$ film), or a composite film of these films. The first insulating film 42 may also be an insulating film (a TEOS film) deposited by a chemical vapor deposition (CVD) method using tetraethoxysilane (TEOS) gas that is an organic silicon compound.

The resistive layers 43a and 43b each have a sheet resistance of about 150 Ω/sq, for example. A resistance value of the resistive layers 43a and 43b can be regulated by adjusting the width (in the depth direction in FIG. 4) and the length (in the right-left direction in FIG. 4) of the resistive layers 43a and 43b.

The resistive layers 43a and 43b may each be a doped polysilicon layer of n-type or p-type, for example. The n-type doped polysilicon layer can be obtained such that n-type impurity ions such as phosphorus (P) are implanted in polycrystalline silicon (polysilicon), or such that polycrystalline silicon is added upon the deposition with a CVD device. The p-type doped polysilicon layer may also be obtained such that p-type impurity ions such as boron (B) are implanted in polysilicon, for example.

The resistive layers 43a and 43b are not limited to the doped polysilicon layers, and may each be a film of a nitride of transition metal such as tantalum nitride ($TaN_x$), or a stacked film of high-fusing-point metallic layers of chromium (Cr), nickel (Ni), and manganese (Mn) stacked in this order. The resistive layers 43a and 43b may each be a thin film of silver-palladium (AgPd) or ruthenium oxide ($RuO_2$) instead.

The resistive layers 43a and 43b have a temperature coefficient of a positive or negative number. The temperature coefficient of the doped polysilicon of the respective resistive layers 43a and 43b can be controlled such that a dose of impurity ions implanted in the polysilicon is regulated. The resistive element 4 may include one of the resistive layers 43a and 43b, or may include three or more resistive layers.

A second insulating film (an interlayer insulating film) 44 is arranged to cover the first insulating film 42 and the respective resistive layers 43a and 43b. The second insulating film 44 as used herein may be a silicon oxide film (a $SiO_2$ film) without containing phosphorus (P) or boron (B) which is typically referred to as a non-doped silicate glass (NSG) film, a phosphorus silica glass (a PSG film), a boron silica glass (a BSG film), a boron phosphosilicate glass (a BPSG film) or a silicon nitride ($Si_3N_4$) film, or a composite film including any of the above films combined together. The second insulating film 44 may be a composite film of the NSG film and the PSG film stacked together, for example.

A top surface electrode 45a, relay wiring layers 45b and 45c, and a guard ring layer 45d are deposited on the second insulating film 44. The top surface electrode 45a, the relay wiring layers 45b and 45c, and the guard ring layer 45d may be composed of a stacked film including a titanium/titanium nitride (Ti/TiN) film serving as barrier metal, an aluminum-silicon (Al—Si) film, and a TiN/Ti film serving as a reflection preventing film. Instead of Al—Si, Al or an Al alloy such as Al—Cu—Si or Al—Cu may be used.

One end of the top surface electrode 45a is connected to one end of the resistive layer 43a via a contact region 46a. The other end of the resistive layer 43a is connected to one end of the relay wiring layer 45b via a contact region 46c. The other end of the relay wiring layer 45b is in ohmic contact with the semiconductor substrate 41 via a contact region 46e at a low contact resistance.

The other end of the top surface electrode 45a is connected to one end of the resistive layer 43b via a contact region 46b. The other end of the resistive layer 43b is connected to one end of the relay wiring layer 45c via a contact region 46d. The other end of the relay wiring layer 45c is in ohmic contact with the semiconductor substrate 41 via a contact region 46f at a low contact resistance.

The guard ring layer 45d is connected to the semiconductor substrate 41 via contact regions 46g and 46h. The guard ring layer 45d has a function of preventing the entrance of moisture through the side surface of the chip.

A passivation film 47 is deposited on the top surface electrode 45a, the relay wiring layers 45b and 45c, and the guard ring layer 45d. The passivation film 47 as used herein may be a composite film including a TEOS film, a $Si_3N_4$ film, and a polyimide film sequentially stacked together, for example. The passivation film 47 is provided with an opening 47a. The part of the top surface electrode 45a exposed on the opening 47a serves as an electrode pad.

A bottom surface electrode 49 is deposited on the bottom surface of the semiconductor substrate 41. The bottom surface electrode 49 has a four-layer structure including a first electrode layer 49a bonded to a top surface of a bonding material 2b such as solder, a second electrode layer 49b arranged in contact with the top surface of the first electrode layer 49a, a third electrode layer 49c arranged in contact with the top surface of the second electrode layer 49b, and a fourth electrode layer 49d arranged in contact with the top surface of the third electrode layer 49c and in contact with the bottom surface of the semiconductor substrate 41.

The first electrode layer 49a and the second electrode layer 49b compose a bonded layer. The first electrode layer 49a is made of gold (Au), for example. The second electrode layer 49b is made of nickel (Ni) or an alloy (Ni-p) mainly including Ni. The third electrode layer 49c serves as a barrier layer. The third electrode layer 49c is made of titanium (Ti), for example. The third electrode layer 49c may have a stacked structure of Ti and titanium nitride (TiN). The fourth electrode layer 49d is made of aluminum (Al)-silicon (Si).

The bonded layer (49a, 49b) composed of the first electrode layer 49a and the second electrode layer 49b of the bottom surface electrode 49 included in the resistive element 4 illustrated in FIG. 4 has the same structure and is made of the same material as the bonded layer (31a, 31b) composed of the first electrode layer 31a and the second electrode layer 31b of the drain electrode 31 included in the semiconductor element 3a illustrated in FIG. 3. The barrier layer that is the third electrode layer 49c of the bottom surface electrode 49 included in the resistive element 4 illustrated in FIG. 4 may have the same structure and may be made of the same material as the barrier layer that is the third electrode layer 31c of the drain electrode 31 included in the semiconductor element 3a illustrated in FIG. 3.

The first electrode layer 49a, the second electrode layer 49b, and the third electrode layer 49c of the bottom surface electrode 49 included in the resistive element 4 illustrated in FIG. 4 may respectively have a thickness equal to or different from that of the first electrode layer 31a, the second electrode layer 31b, and the third electrode layer 31c of the drain electrode 31 included in the semiconductor element 3a illustrated in FIG. 3.

Figure 5:
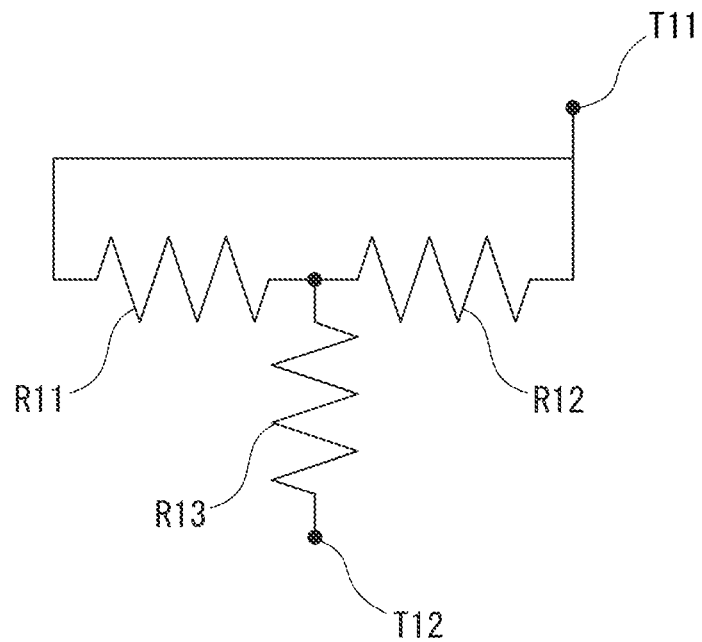
FIG. 5 is a circuit diagram of a resistive element according to the first embodiment.

FIG. 5 illustrates an equivalent circuit of the resistive element 4 illustrated in FIG. 4. As illustrated in FIG. 5, a terminal T11 is connected in parallel to one end of each of resistors R11 and R12. The other end of each of the resistors R11 and R12 is connected to one end of a resistor R13. The other end of the resistor R13 is connected to a terminal T12. The resistor R11, the resistor R12, and the resistor R13 illustrated in FIG. 5 respectively correspond to the resistive layer 43a, the resistive layer 43b, and the semiconductor substrate 41 illustrated in FIG. 4. The terminal T11 and the terminal T12 illustrated in FIG. 5 respectively correspond to the top surface electrode 45a and the bottom surface electrode 49 illustrated in FIG. 4.

One end of each of an auxiliary positive electrode terminal (a voltage detection terminal) 7a, temperature detection terminals 7b and 7c, control terminals 7d and 7f, and auxiliary source terminals (voltage detection terminals) 7e and 7g is arranged on the stepped part 81 of the case member 8 illustrated in FIG. 1. The auxiliary positive electrode terminal 7a, the temperature detection terminals 7b and 7c, the control terminals 7d and 7f, and the auxiliary source terminals 7e and 7g each extend to the inside of the side wall part 82 of the case member 8. The other end of each of the auxiliary positive electrode terminal 7a, the temperature detection terminals 7b and 7c, the control terminals 7d and 7f, and the auxiliary source terminals 7e and 7g projects from the top surface of the side wall part 82.

The auxiliary positive electrode terminal 7a is connected to the upper conductor layer 11e via the bonding wire 5t. The auxiliary positive electrode terminal 7a detects a voltage of a drain electrode of the respective semiconductor elements 3c and 3d.

The temperature detection terminal 7b is connected to the electrode pad of the top surface electrode 45a of the resistive element 4 via the bonding wire 5u. The temperature detection terminal 7c is connected to, via the bonding wire 5v, the upper conductor layer 11d on which the resistive element 4 is mounted. The temperature detection terminals 7b and 7c are connected to a current application circuit (not illustrated) that applies a constant direct current to both ends of the resistive element 4. The circumferential temperature around the semiconductor elements 3a to 3h is detected in accordance with temperature detection signals acquired via the temperature detection terminals 7b and 7c.

The control terminal 7d is connected to the upper conductor layer 11f via the bonding wire 5f. The upper conductor layer 11f is electrically connected to the gate electrode of the respective semiconductor elements 3a to 3d via the bonding wires 5g to 5j. A control signal is applied to the gate electrode of the respective semiconductor elements 3a to 3d via the control terminal 7d.

The auxiliary source terminal 7e is connected to the upper conductor layer 11g via the bonding wire 5a. The upper conductor layer 11g is connected to the source electrode of the respective semiconductor elements 3a to 3d via the bonding wires 5b to 5e. The auxiliary source terminal 7e detects a current flowing through the source electrode of the respective semiconductor elements 3a to 3d.

The control terminal 7f is electrically connected to the gate electrode of the respective semiconductor elements 3e to 3h via the bonding wires 5p to 5s. The auxiliary source terminal 7g is connected to the upper conductor layer 11i via the bonding wire 5k. The upper conductor layer 11i is connected to the source electrode of the respective semiconductor elements 3e to 3h via the bonding wires 5l to 5o.

The case member 8 is further provided with a positive electrode terminal 8a, a negative electrode terminal 8b, and an output terminal 8c. The positive electrode terminal 8a is connected to the respective upper conductor layers 11a and 11e. The negative electrode terminal 8b is connected to the upper conductor layer 11h. The upper conductor layer 11h is electrically connected to the source electrode of the respective semiconductor elements 3e to 3h via the wiring layers 6e to 6h. The output terminal 8c is connected to the upper conductor layer 11b. The upper conductor layer 11b is electrically connected to the source electrode of the respective semiconductor elements 3a to 3d via the wiring layers 6a to 6d.

Figure 6:
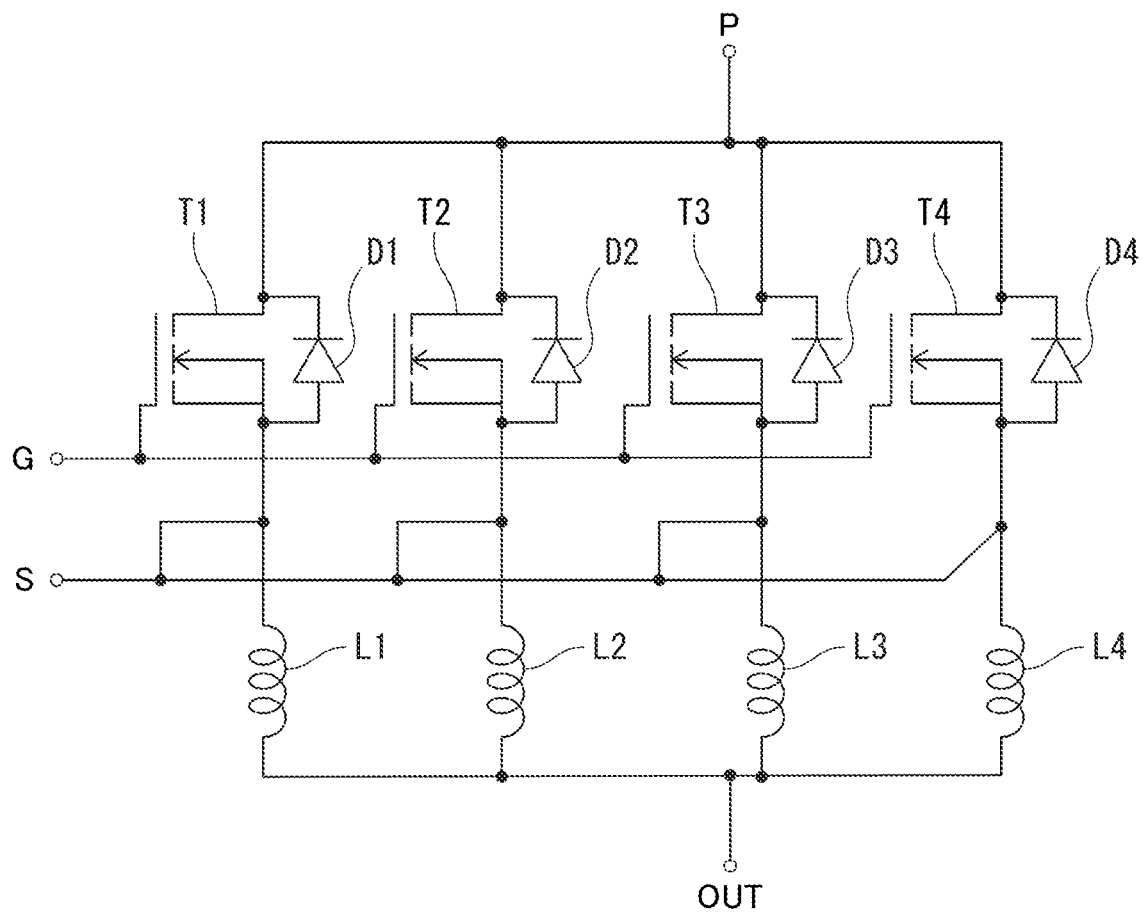
FIG. 6 is a circuit diagram of the semiconductor device according to the first embodiment.

FIG. 6 illustrates an equivalent circuit on the upper arm side implemented by the semiconductor elements 3a to 3d illustrated in FIG. 1. Transistors T1 to T4 illustrated in FIG. 6 respectively correspond to the semiconductor elements 3a to 3d illustrated in FIG. 1. The transistors T1 to T4 are connected in antiparallel to freewheeling diodes (FWDs) D1 to D4. The freewheeling diodes D1 to D4 may be installed in the semiconductor elements 3a to 3d illustrated in FIG. 1.

A drain electrode of the respective transistors T1 to T4 is connected to a positive electrode terminal P. A source electrode of the respective transistors T1 to T4 is connected to an output terminal OUT via parasitic inductances L1 to L4. The source electrode of the respective transistors T1 to T4 is connected to an auxiliary source terminal S. A gate electrode of the respective transistors T1 to T4 is connected to a control terminal G. The positive electrode terminal P, the output terminal OUT, the control terminal G, and the auxiliary source terminal S illustrated in FIG. 6 respectively correspond to the positive electrode terminal 8a, the output terminal 8c, the control terminal 7d, and the auxiliary source terminal 7e illustrated in FIG. 1.

An example of a method of manufacturing the semiconductor device according to the first embodiment is described below with reference to the flowchart illustrated in FIG. 7. In step S1, the insulating circuit substrate 1 of a DCB substrate, for example, is prepared. In step S2, a bonding material such as solder is deposited on the insulating circuit substrate 1. The semiconductor elements 3a to 3h and the resistive element 4 are further deposited on the insulating circuit substrate 1 via the bonding material. In step S3, the insulating circuit substrate 1 is bonded to the semiconductor elements 3a to 3h and the resistive element 4 via the bonding material by heat treatment under a hydrogen atmosphere. In step S4, an X-ray inspection is executed so as to examine the quality of the insulating circuit substrate 1 on which the semiconductor elements 3a to 3h and the resistive element 4 are deposited. The semiconductor elements 3a to 3h and the resistive element 4 are then mounted on the case member 8, and are sealed with the sealing member 9.

The semiconductor device according to the first embodiment, which includes the resistive element 4 mounted on the insulating circuit substrate 1 and used as a temperature sensor, can detect the circumferential temperature around the semiconductor elements 3a to 3h.

Figure 7:
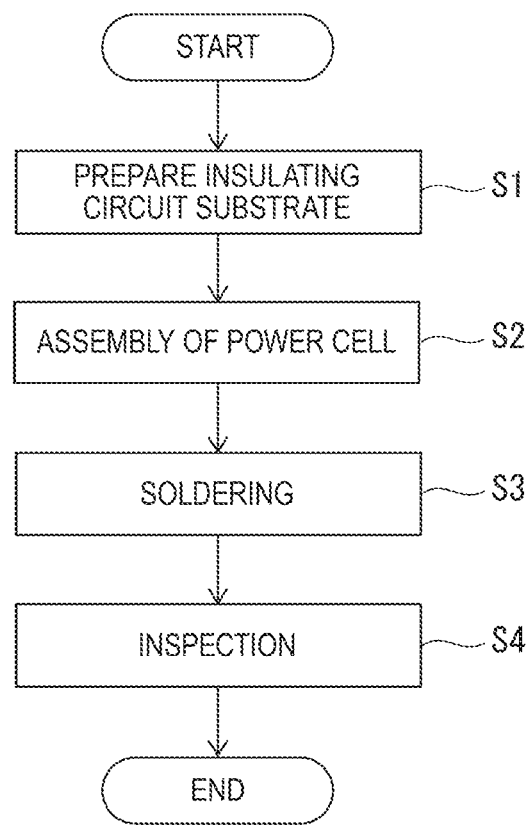
FIG. 7 is a flowchart of a method for manufacturing the semiconductor device according to the first embodiment.

In conventional semiconductor devices using a NTC thermistor as a temperature sensor, a deterioration of Ni plating or Sn plating of a bottom surface electrode of the NTC thermistor may be caused during the soldering step under the hydrogen atmosphere in step S3 illustrated in FIG. 7. In contrast, the semiconductor device according to the first embodiment has the configuration in which at least the bonded layer (49a, 49b) of the bottom surface electrode 49 of the resistive element 4 has the same structure as the bonded layer (31a, 31b) of the drain electrode 31 of the semiconductor element 3a without using either Ni plating or Sn plating. This configuration can prevent a deterioration of the bottom surface electrode 49 of the resistive element 4 during the soldering step under the hydrogen atmosphere in step S3 illustrated in FIG. 7.

First Modified Example of First Embodiment

Figure 8:
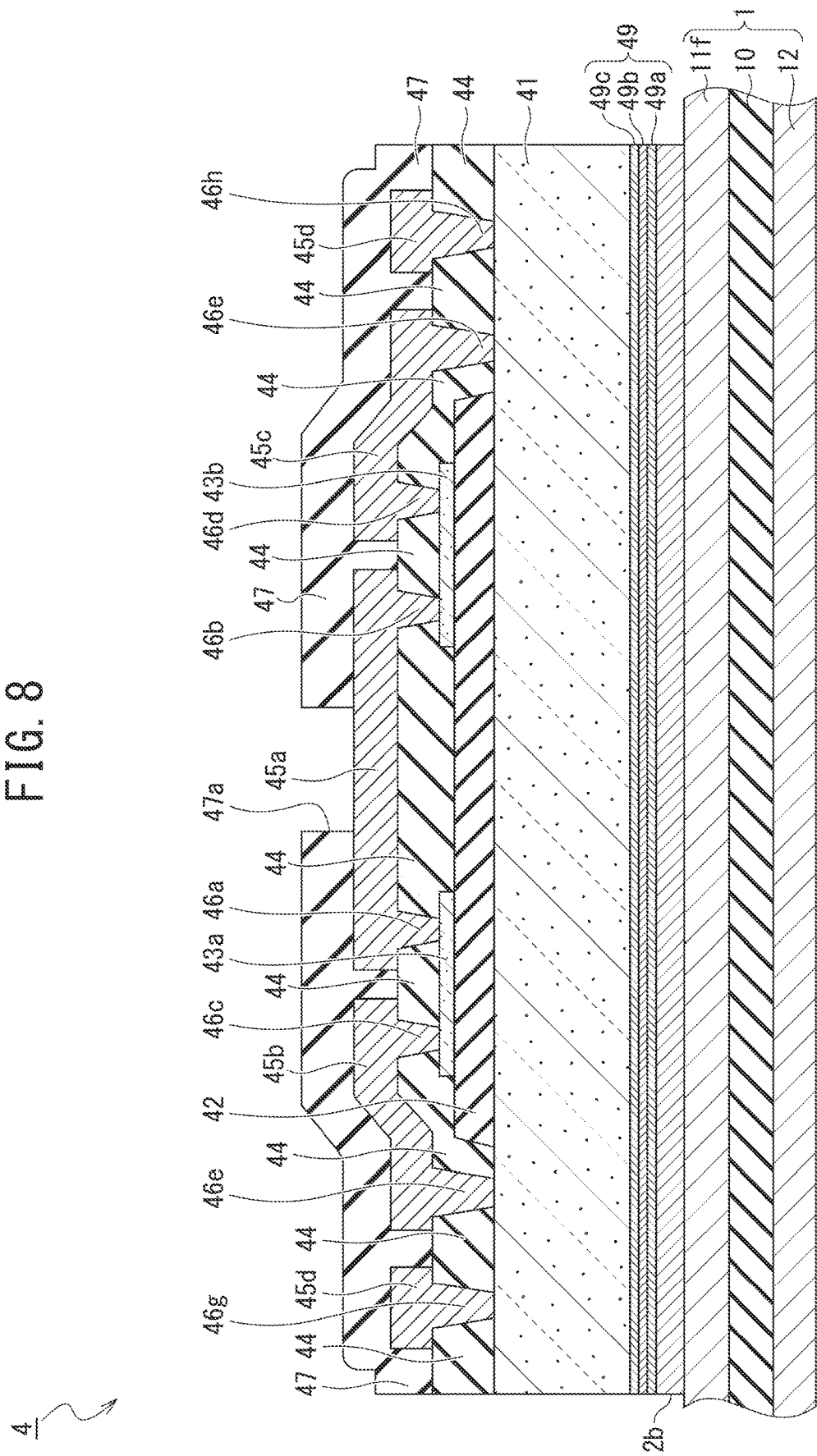
FIG. 8 is a cross-sectional view of a resistive element according to a first modified example of the first embodiment.

A resistive element 4 according to a first modified example of the first embodiment differs from the resistive element 4 according to the first embodiment illustrated in FIG. 4 in that the semiconductor substrate 41 is a compound semiconductor substrate of silicon carbide (SiC) and the like, instead of the silicon (Si) substrate, and in that the bottom surface electrode 49 has a three-layer structure, as illustrated in FIG. 8.

The bottom surface electrode 49 of the resistive element 4 illustrated in FIG. 8 includes the first electrode layer 49a bonded to the top surface of the bonding material 2b, the second electrode layer 49b arranged in contact with the top surface of the first electrode layer 49a, and the third electrode layer 49c arranged in contact with the top surface of the second electrode layer 49b and in contact with the bottom surface of the semiconductor substrate 41.

The first electrode layer 49a and the second electrode layer 49b compose a bonded layer. The first electrode layer 49a is made of gold (Au), for example. The second electrode layer 49b is made of nickel (Ni) or an alloy (Ni-p) mainly including Ni, for example. The third electrode layer 49c serves as a barrier layer. The third electrode layer 49c is made of titanium (Ti), for example. The third electrode layer 49c may have a stacked structure of Ti and titanium nitride (TiN).

The bottom surface electrode 49 of the resistive element 4 illustrated in FIG. 8 has the same structure as the drain electrode 31 of the semiconductor element 3a illustrated in FIG. 4. In particular, the bonded layer (49a, 49b) composed of the first electrode layer 49a and the second electrode layer 49b of the bottom surface electrode 49 of the resistive element 4 illustrated in FIG. 8 has the same structure as the bonded layer (31a, 31b) composed of the first electrode layer 31a and the second electrode layer 31b of the drain electrode 31 of the semiconductor element 3a illustrated in FIG. 4. The barrier layer that is the third electrode layer 49c of the bottom surface electrode 49 of the resistive element 4 illustrated in FIG. 8 has the same structure as the barrier layer that is the third electrode layer 31c of the drain electrode 31 included in the semiconductor element 3a illustrated in FIG. 4.

The semiconductor device according to the first modified example of the first embodiment that uses the resistive element 4 as illustrated in FIG. 8 can also prevent a deterioration of the bottom surface electrode 49 of the resistive element 4 during the soldering step under the hydrogen atmosphere in step S3 illustrated in FIG. 7.

Second Modified Example of First Embodiment

Figure 9:
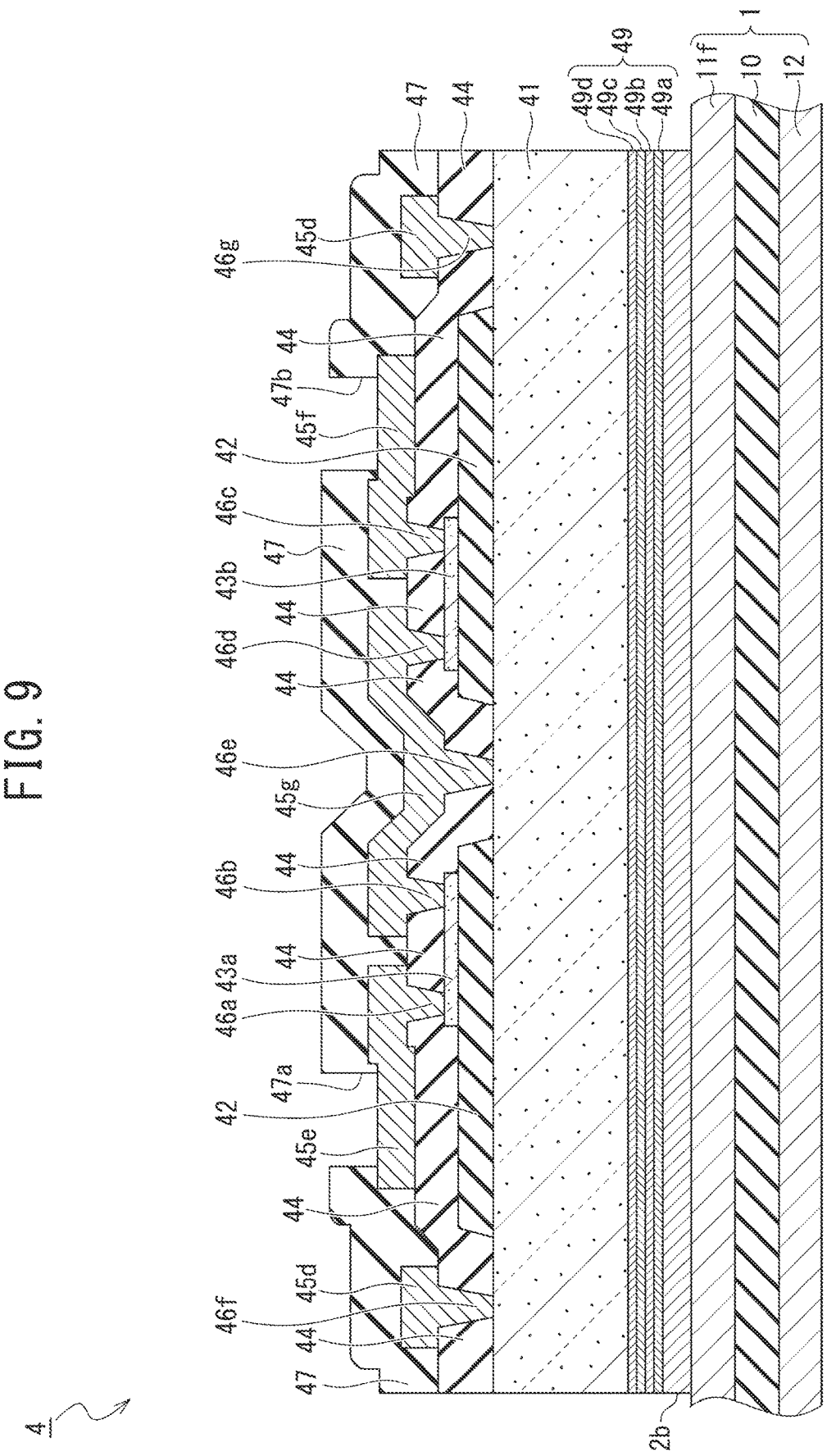
FIG. 9 is a cross-sectional view of a resistive element according to a second modified example of the first embodiment.

A resistive element 4 according to a second modified example of the first embodiment differs from the resistive element 4 according to the first embodiment illustrated in FIG. 4 in including two top surface electrodes 45e and 45f i as illustrated in FIG. 9. The exposed parts of the top surface electrodes 45e and 45f exposed on the openings 47a and 47b of the passivation film 47 serve as electrode pads.

The top surface electrodes 45e and 45f are arranged to interpose a relay wiring layer 45g. One end of the top surface electrode 45e is connected to one end of the resistive layer 43a via the contact region 46a. The other end of the resistive layer 43a is connected to one end of the relay wiring layer 45g via the contact region 46b. One end of the top surface electrode 45f is connected to one end of the resistive layer 43b via the contact region 46c. The other end of the resistive layer 43b is connected to the other end of the relay wiring layer 45g via the contact region 46d. The middle part of the relay wiring layer 45g is in ohmic contact with the semiconductor substrate 41 via the contact region 46e at a low contact resistance.

Figure 10:
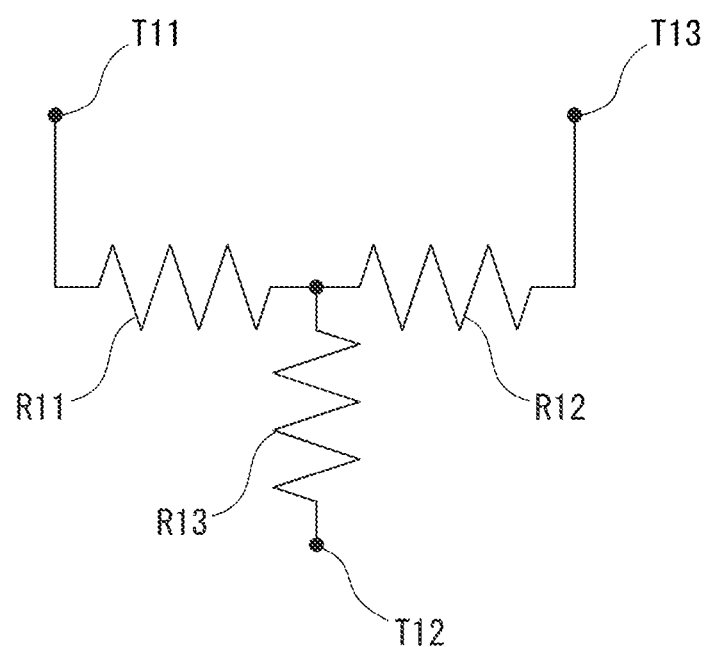
FIG. 10 is a circuit diagram of the resistive element according to the second modified example of the first embodiment.

FIG. 10 illustrates an equivalent circuit of the resistive element 4 illustrated in FIG. 9. As illustrated in FIG. 10, the resistive element 4 includes three terminals T11, T12, and T13. The terminal T11 is connected to one end of the resistor R11. The terminal T13 is connected to one end of the resistor R12. The other end of the respective resistors R11 and R12 is connected to one end of the resistor R13. The other end of the resistor R13 is connected to the terminal T12. The resistor R11, the resistor R12, and the resistor R13 illustrated in FIG. 10 respectively correspond to the resistive layer 43a, the resistive layer 43b, and the semiconductor substrate 41 illustrated in FIG. 9. The terminals T11 and T13 and the terminal T12 illustrated in FIG. 10 respectively correspond to the top surface electrodes 45e and 45f and the bottom surface electrode 49 illustrated in FIG. 9.

When the resistive layer 43a of the resistive element 4 illustrated in FIG. 9 is used as a temperature sensor, the electrode pad of the top surface electrode 45e may be connected to the temperature detection terminal 7b illustrated in FIG. 1 via a bonding wire. When the resistive layer 43b of the resistive element 4 illustrated in FIG. 9 is used as a temperature sensor, the electrode pad of the top surface electrode 45f may be connected to the temperature detection terminal 7b illustrated in FIG. 1 via a bonding wire.

When both the resistive layers 43a and 43b of the resistive element 4 illustrated in FIG. 9 are used as temperature sensors, the respective electrode pads of the top surface electrodes 45e and 45f may be connected to the common temperature detection terminal 7b via bonding wires. When the resistive layers 43a and 43b of the resistive element 4 illustrated in FIG. 9 are independently used as a temperature sensor, another temperature detection terminal similar to the temperature detection terminal 7b illustrated in FIG. 1 may be provided, so that one of the two electrode pads of the top surface electrodes 45e and 45f is connected to the temperature detection terminal 7b, and the other electrode pad is connected to the other temperature detection terminal.

The semiconductor device according to the second modified example of the first embodiment that uses the resistive element 4 as illustrated in FIG. 9 can also prevent a deterioration of the bottom surface electrode 49 of the resistive element 4 during the soldering step under the hydrogen atmosphere in step S3 illustrated in FIG. 7.

Third Modified Example of First Embodiment

Figure 11:
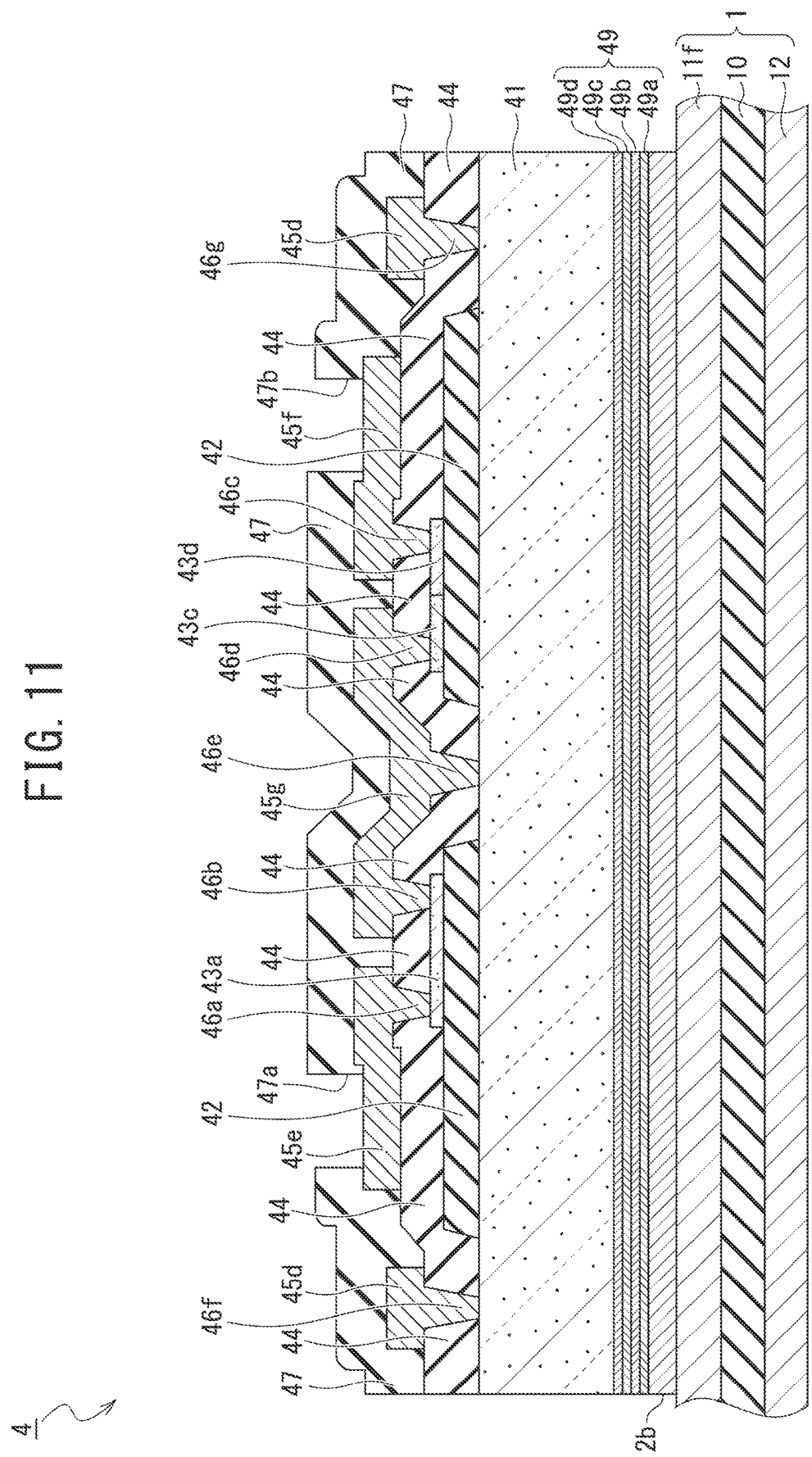
FIG. 11 is a cross-sectional view of a resistive element according to a third modified example of the first embodiment.

A resistive element 4 according to a third modified example of the first embodiment differs from the resistive element 4 according to the second modified example of the first embodiment illustrated in FIG. 9 in including a p-n junction diode (43c, 43d) instead of the resistive layer 43b, as illustrated in FIG. 11. The p-n junction diode (43c, 43d) includes a semiconductor layer 43c of n-type deposited on the first insulating film 42, and a semiconductor layer 43d of p-type deposited on the first insulating film 42 and arranged in contact with the n-type semiconductor layer 43c. The n-type semiconductor layer 43c is connected to the relay wiring layer 45g via the contact region 46d. The p-type semiconductor layer 43d is connected to the top surface electrode 45f via the contact region 46c.

Figure 12A:
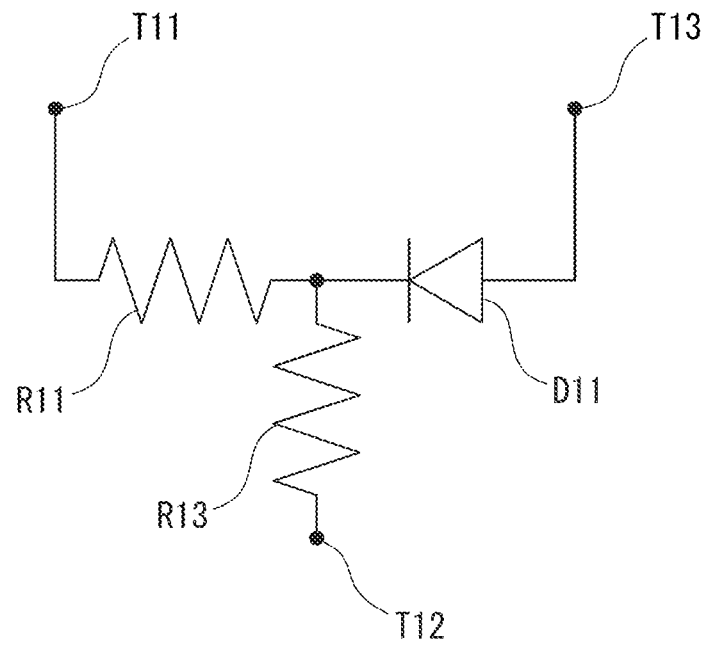
FIG. 12A is a circuit diagram of the resistive element according to the third modified example of the first embodiment.

FIG. 12A illustrates an equivalent circuit of the resistive element 4 illustrated in FIG. 11. As illustrated in FIG. 12A, the terminal T11 is connected to one end of the resistor R11. The terminal T13 is connected to an anode of a diode D11. The other end of the resistor R11 and a cathode of the diode D11 are connected to one end of the resistor R13. The other end of the resistor R13 is connected to the terminal T12. The resistor R11, the diode D11, and the resistor R13 illustrated in FIG. 12A respectively correspond to the resistive layer 43a, the p-n junction diode (43c, 43d), and the semiconductor substrate 41 illustrated in FIG. 11. The terminals T11 and T13 and the terminal T12 illustrated in FIG. 12A respectively correspond to the top surface electrodes 45e and 45f and the bottom surface electrode 49 illustrated in FIG. 11.

When the resistive layer 43a of the resistive element 4 illustrated in FIG. 11 is used as a temperature sensor, the electrode pad of the top surface electrode 45e may be connected to the temperature detection terminal 7b illustrated in FIG. 1. When the p-n junction diode (43c, 43d) of the resistive element 4 illustrated in FIG. 11 is used as a temperature sensor, the electrode pad of the top surface electrode 45f may be connected to the temperature detection terminal 7b illustrated in FIG. 1.

When both the resistive layer 43a and the p-n junction diode (43c, 43d) of the resistive element 4 illustrated in FIG. 11 are used as temperature sensors, the respective electrode pads of the top surface electrodes 45e and 45f may be connected to the common temperature detection terminal 7b. When the resistive layer 43a and the p-n junction diode (43c, 43d) of the resistive element 4 illustrated in FIG. 11 are independently used as a temperature sensor, another temperature detection terminal similar to the temperature detection terminal 7b illustrated in FIG. 1 may be provided, so that one of the two electrode pads of the top surface electrodes 45e and 45f is connected to the temperature detection terminal 7b, and the other electrode pad is connected to the other temperature detection terminal.

The semiconductor device according to the third modified example of the first embodiment that uses the resistive element 4 as illustrated in FIG. 11 can also prevent a deterioration of the top surface electrodes 45e and 45f and the bottom surface electrode 49 of the resistive element 4 during the soldering step under the hydrogen atmosphere in step S3 illustrated in FIG. 7.

Figure 12B:
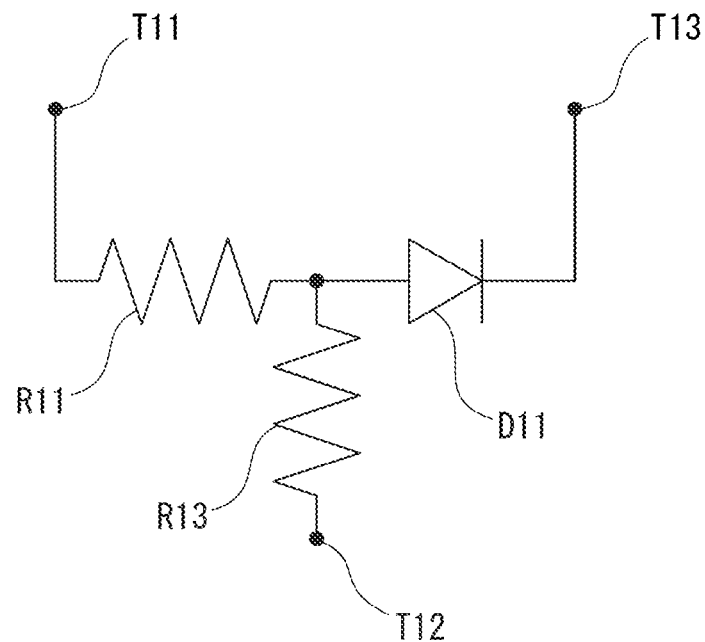
FIG. 12B is another circuit diagram of the resistive element according to the third modified example of the first embodiment.

The anode and the cathode of the p-n junction diode illustrated in FIG. 11 and FIG. 12A may be switched. In particular, the n-type semiconductor layer 43c of the p-n junction diode (43c, 43d) illustrated in FIG. 11 may be switched to the p-type, and the p-type semiconductor layer 43d may be switched to the n-type. FIG. 12B illustrates an equivalent circuit of the resistive element 4 in this case. As illustrated in FIG. 12B, the cathode of the diode D11 is connected to the terminal T13, and the anode of the diode D11 is connected to one end of the respective resistors R11 and R13.

Fourth Modified Example of First Embodiment

Figure 13:
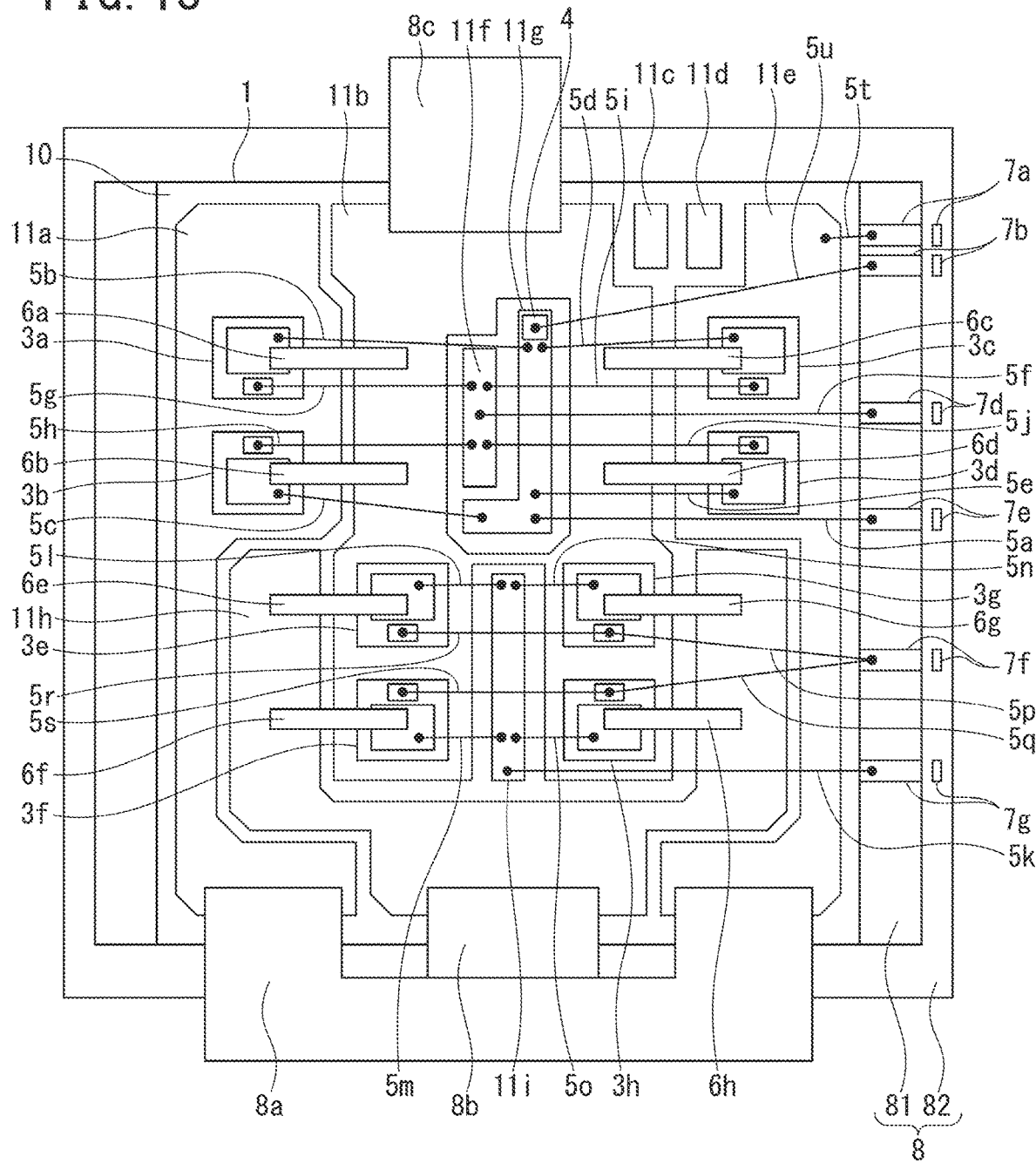
FIG. 13 is a plan view of a semiconductor device according to a fourth modified example of the first embodiment.

A semiconductor device according to a fourth modified example of the first embodiment differs from the semiconductor device according to the first embodiment illustrated in FIG. 1 in that the resistive element 4 used as a temperature sensor is deposited on the top surface of the upper conductor layer 11g as a relay point for electrically connecting the auxiliary source terminal 7e and the source electrode of the respective semiconductor elements 3a to 3d, as illustrated in FIG. 13.

The resistive element 4 has a structure similar to that of the resistive element 4 as illustrated in FIG. 4, for example. As illustrated in FIG. 13, the electrode pad implemented by the top surface electrode of the resistive element 4 is connected to the temperature detection terminal 7b via the bonding wire 5u. The bottom surface electrode of the resistive element 4 is bonded to the top surface of the upper conductor layer 11g via a bonding material such as solder. The bottom surface electrode of the resistive element 4 is electrically connected to the auxiliary source terminal 7e via the upper conductor layer 11g and the bonding wire 5a.

The semiconductor device according to the fourth modified example of the first embodiment, which includes the resistive element 4 mounted on the upper conductor layer 11g to which the source electrode of the respective semiconductor elements 3a to 3d is bonded, can use the auxiliary source terminal 7e as a common terminal to which the bottom surface electrode of the resistive element 4 is connected. The semiconductor device according to the fourth modified example of the first embodiment thus can eliminate the temperature detection terminal 7c electrically connected to the bottom surface electrode of the resistive element 4 and thus reduce the number of the terminals by one, as compared with the semiconductor device according to the first embodiment illustrated in FIG. 1.

Second Embodiment

Figure 14:
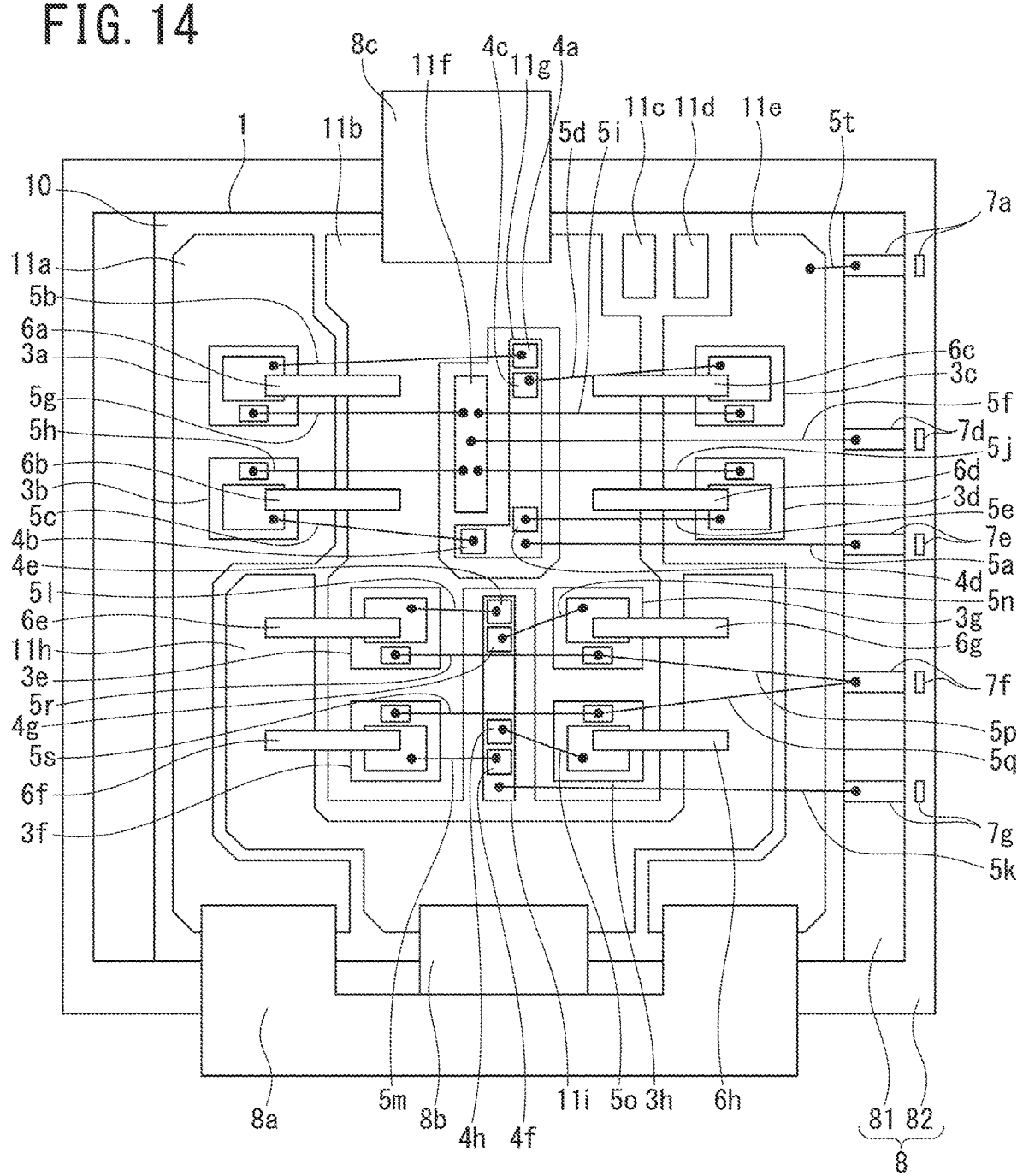
FIG. 14 is a plan view of a semiconductor device according to a second embodiment.

A semiconductor device according to a second embodiment differs from the semiconductor device according to the first embodiment illustrated in FIG. 1 in including a plurality of (eight) resistive elements 4a to 4h mounted on the insulating circuit substrate 1, and using the resistive elements 4a to 4h each as a resistor (a source resistor) connected to the source electrode of the respective semiconductor elements 3a to 3h, as illustrated in FIG. 14.

The respective resistive elements 4a to 4h have a structure similar to that of the resistive element 4 as illustrated in FIG. 4, for example. In the semiconductor device according to the second embodiment, the resistive elements 4a to 4h each serve as a source resistor, and thus preferably do not have the temperature characteristics but have a substantially constant resistance value with respect to a temperature change.

As illustrated in FIG. 14, the resistive elements 4a to 4d are mounted on the upper conductor layer 11g. The bottom surface electrode of the respective resistive elements 4a to 4d is bonded to the top surface of the upper conductor layer 11g via a bonding material such as solder. The top surface electrode of the respective resistive elements 4a to 4d is connected to the source electrode on the top surface side of the respective semiconductor elements 3a to 3d via the bonding wires 5b to 5e.

The resistive elements 4e to 4h are mounted on the upper conductor layer 11i. The bottom surface electrode of the respective resistive elements 4e to 4h is bonded to the top surface of the upper conductor layer 11i via a bonding material such as solder. The top surface electrode of the respective resistive elements 4e to 4h is connected to the source electrode on the top surface side of the respective semiconductor elements 3e to 3h via the bonding wires 5l to 5o. The other configurations of the semiconductor device according to the second embodiment are substantially the same as those of the semiconductor device according to the first embodiment illustrated in FIG. 1, and overlapping explanations are not repeated below.

Figure 15:
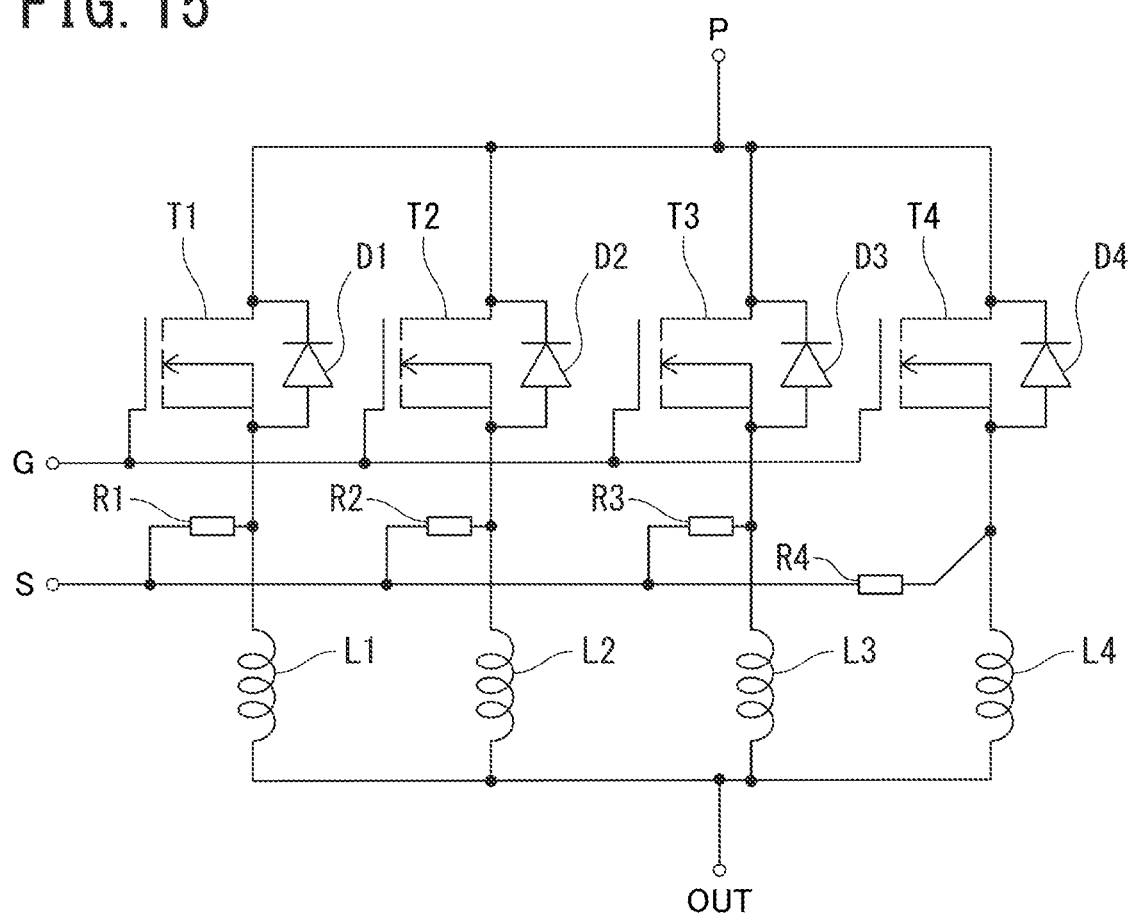
FIG. 15 is a circuit diagram of the semiconductor device according to the second embodiment.

FIG. 15 illustrates an equivalent circuit on the upper arm side implemented by the semiconductor elements 3a to 3d illustrated in FIG. 14. The equivalent circuit illustrated in FIG. 15 differs from the equivalent circuit of the semiconductor device according to the first embodiment illustrated in FIG. 6 in that resistors (source resistors) R1 to R4 are connected between the respective source electrodes of the transistors T1 to T4 and the auxiliary source terminal S. The resistance value of the respective source resistors R1 to R4 is about one S2, for example, but is not limited to this value. The resistors R1 to R4 illustrated in FIG. 15 respectively correspond to the resistive elements 4a to 4d illustrated in FIG. 14.

Figure 16:
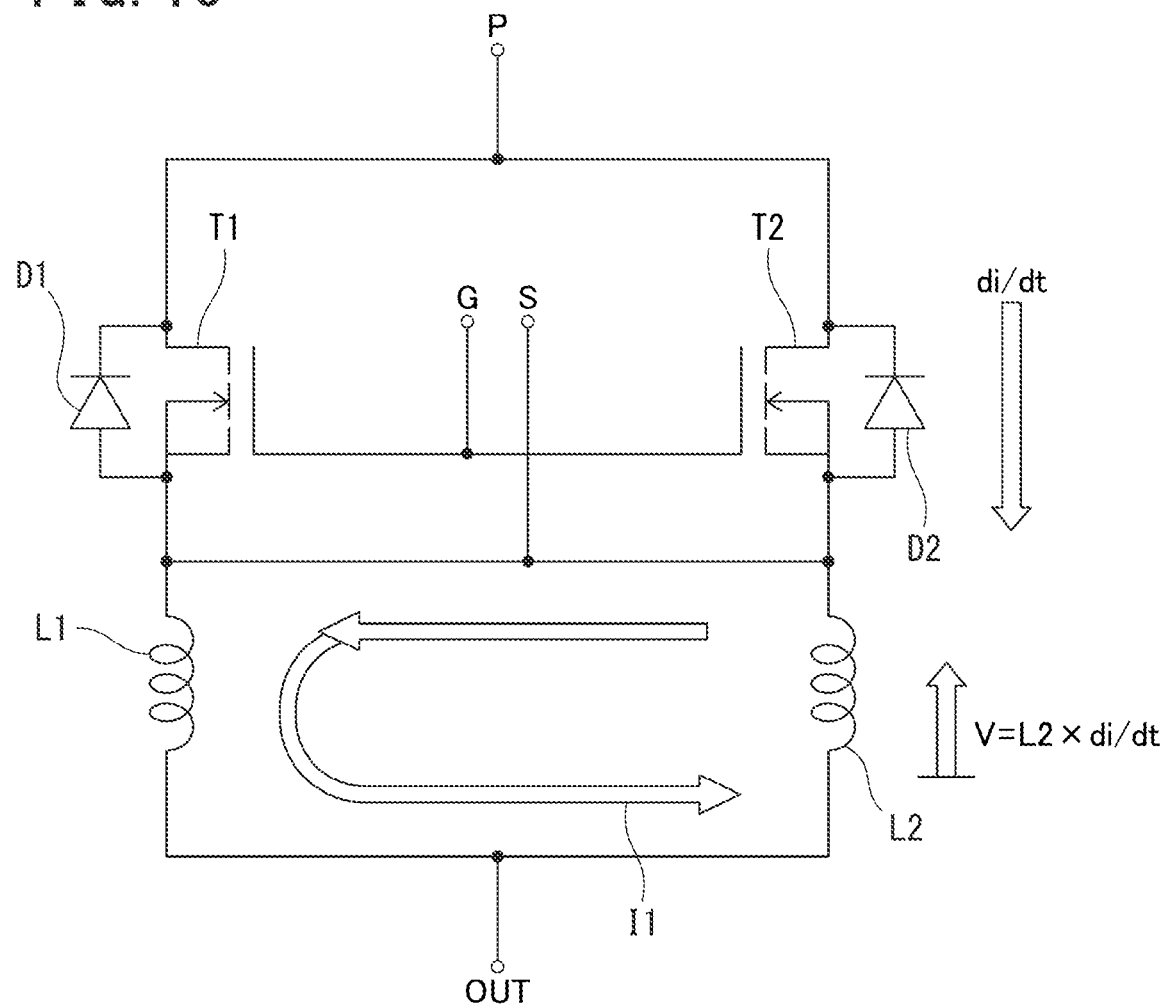
FIG. 16 is a circuit diagram of a semiconductor device of a first comparative example of the second embodiment.

A case is described below in terms of the semiconductor elements 3a and 3b on the assumption that the resistors R1 and R2 are not provided between the respective source electrodes of the semiconductor elements 3a and 3b and the auxiliary source terminal S, as illustrated in FIG. 16. A rate di/dt of the main circuit increases in association with the switching operation of the semiconductor elements 3a and 3b. If the semiconductor element 3a is turned on first because of a difference in gate threshold voltage between the semiconductor elements 3a and 3b, for example, a counter electromotive force is caused at the parasitic inductance L2 of the main circuit due to the rate di/dt of the main circuit. In this case, an excessive loop current I1 flows between the auxiliary source and the auxiliary source of the semiconductor elements 3a and 3b (schematically indicated by the arrows in FIG. 16), which may cause the bonding wire to break.

Figure 17:
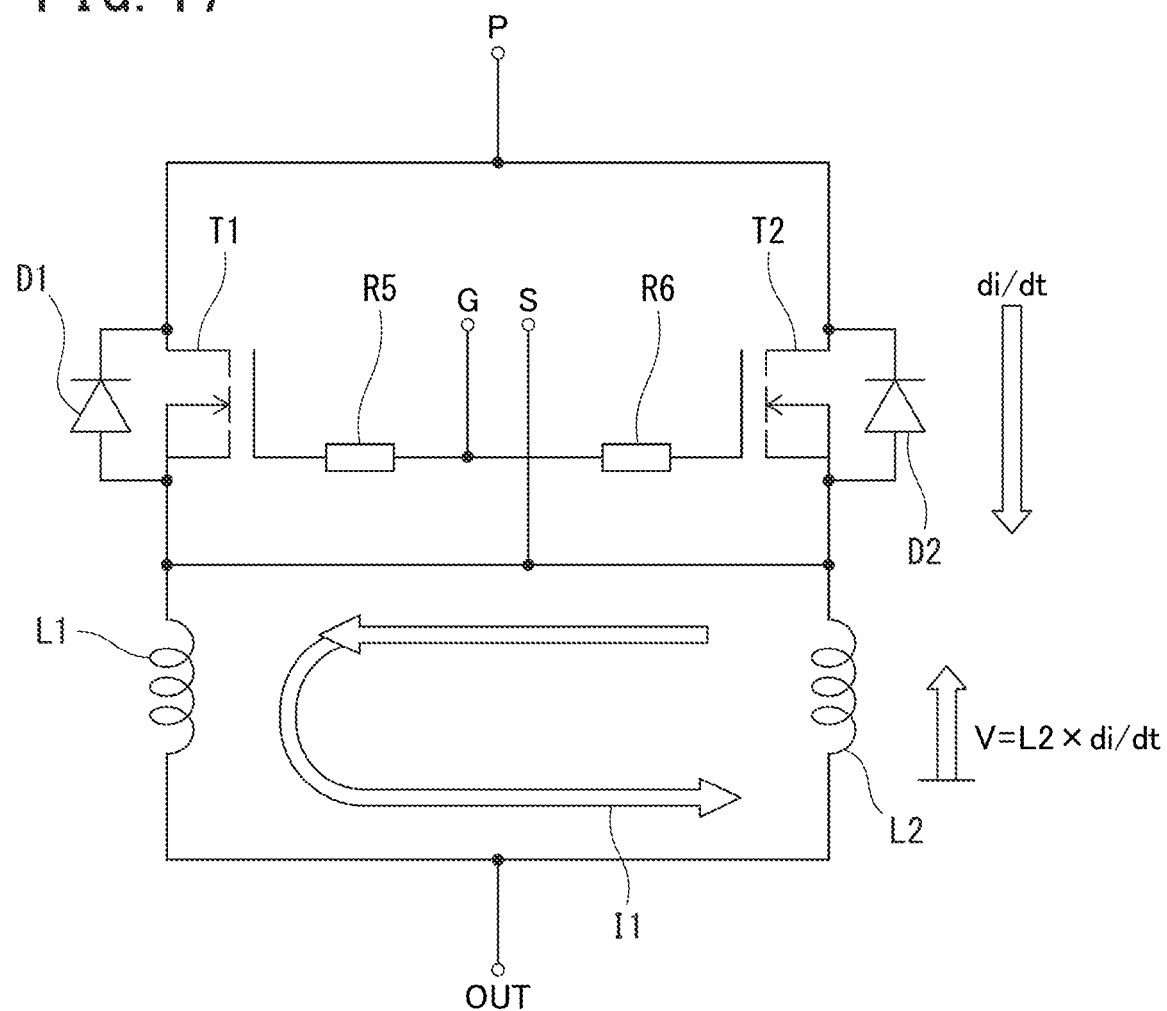
FIG. 17 is a circuit diagram of a semiconductor device of a second comparative example of the second embodiment.

Another case is described below on the assumption that the resistors R1 and R2 are not provided between the respective source electrodes of the semiconductor elements 3a and 3b and the auxiliary source terminal S, as in the case illustrated in FIG. 16, but gate resistors R5 and R6 are connected to the gate electrodes of the semiconductor elements 3a and 3b, as illustrated in FIG. 17. If the semiconductor element 3a is turned on first, the rate di/dt of the main circuit is regulated due to the gate resistor R6, so as to avoid the occurrence of the counter electromotive force at the parasitic inductance L2. However, since there is no resistor between the auxiliary source and the auxiliary source of the semiconductor elements 3a and 3b, a loop current I1 flows between the auxiliary source and the auxiliary source of the semiconductor elements 3a and 3b.

Figure 18:
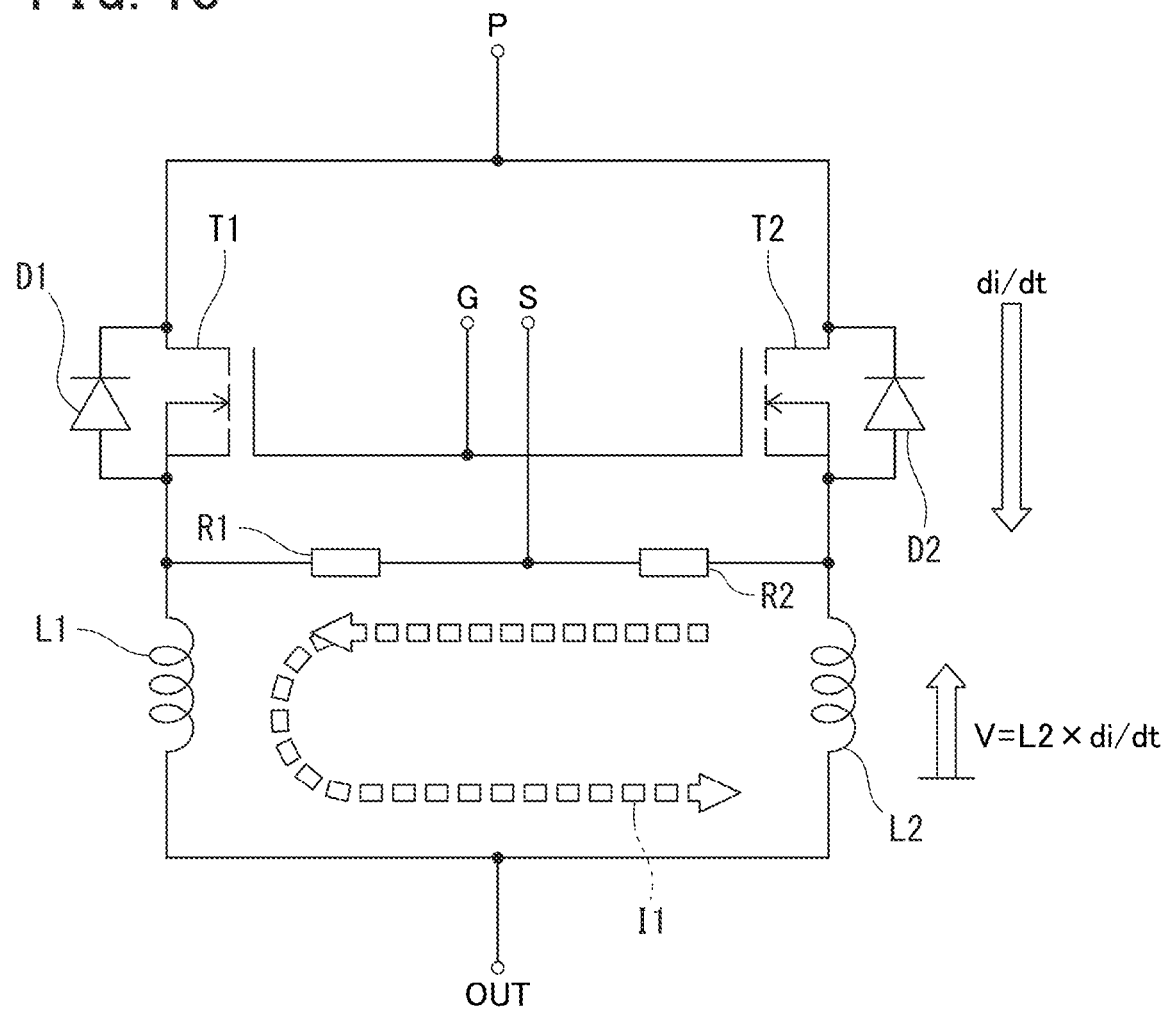
FIG. 18 is a circuit diagram of the semiconductor device according to the second embodiment.

The semiconductor device according to the second embodiment has the configuration in which the source resistors R1 and R2 are connected between the respective source electrodes of the semiconductor elements 3a and 3b and the auxiliary source terminal S, as illustrated in FIG. 18. If the semiconductor element 3a is turned on first, the rate di/dt of the main circuit can be regulated due to the source resistors R1 and R2, so as to avoid the occurrence of the counter electromotive force at the parasitic inductance L2. Further, a loop current I1 is prevented from flowing between the auxiliary source and the auxiliary source of the semiconductor elements 3a and 3b, so as to prevent the bonding wire from breaking.

First Modified Example of Second Embodiment

Figure 19:
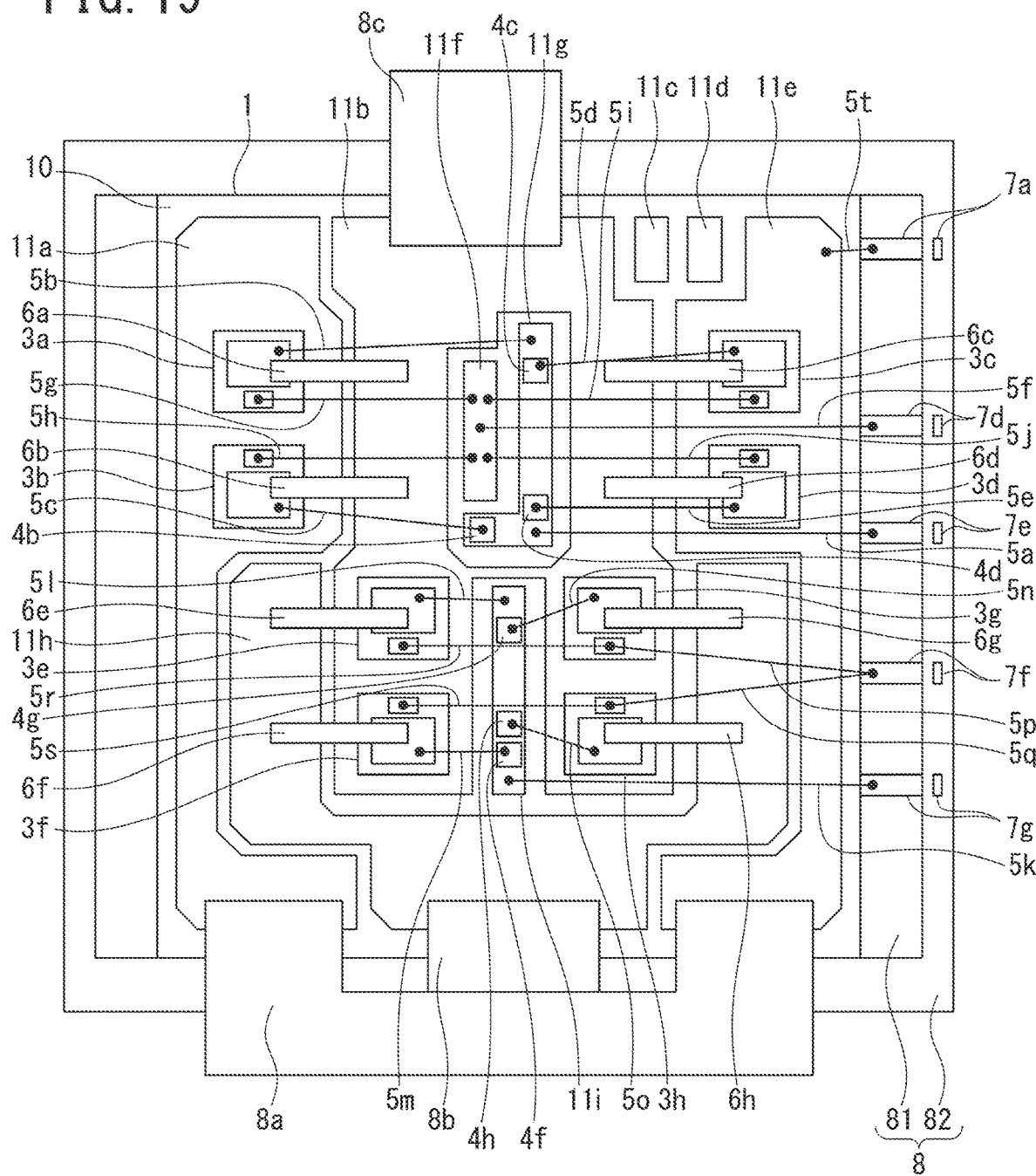
FIG. 19 is a plan view of a semiconductor device according to a first modified example of the second embodiment.

A semiconductor device according to a first modified example of the second embodiment differs from the semiconductor device according to the second embodiment illustrated in FIG. 14 in including the six resistive elements 4b to 4d and 4f to 4g excluding the two resistive elements 4a and 4e, as illustrated in FIG. 19. The configuration and the arranged positions of the resistive elements 4b to 4d and 4f to 4g are common to those in the semiconductor device according to the second embodiment illustrated in FIG. 14.

Figure 20:
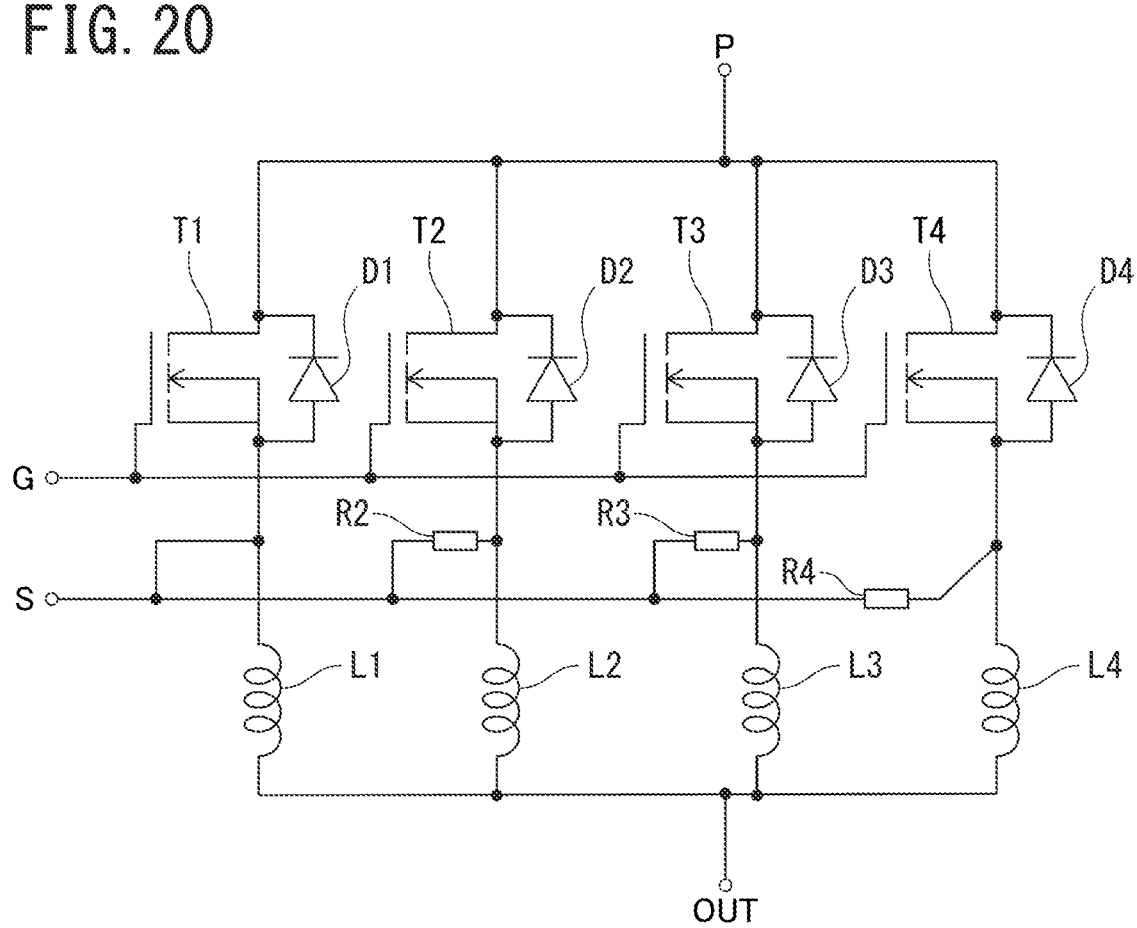
FIG. 20 is a circuit diagram of the semiconductor device according to the first modified example of the second embodiment.

FIG. 20 illustrates an equivalent circuit on the upper arm side implemented by the semiconductor elements 3a to 3d illustrated in FIG. 19. The equivalent circuit illustrated in FIG. 20 differs from the equivalent circuit of the semiconductor device according to the second embodiment illustrated in FIG. 15 in that the resistor (the source resistor) R1 is not connected between the source electrode of the transistor T1 and the auxiliary source terminal S.

The semiconductor device according to the first modified example of the second embodiment can regulate the rate di/dt of the main circuit due to the source resistors R2 to R4, so as to avoid the occurrence of the counter electromotive force at the parasitic inductances L2 to L4, and can prevent a loop current from flowing between the auxiliary source and the auxiliary source of the respective semiconductor elements 3a to 3d and the respective semiconductor elements 3e to 3h, so as to prevent the bonding wires from breaking.

Second Modified Example of Second Embodiment

Figure 21:
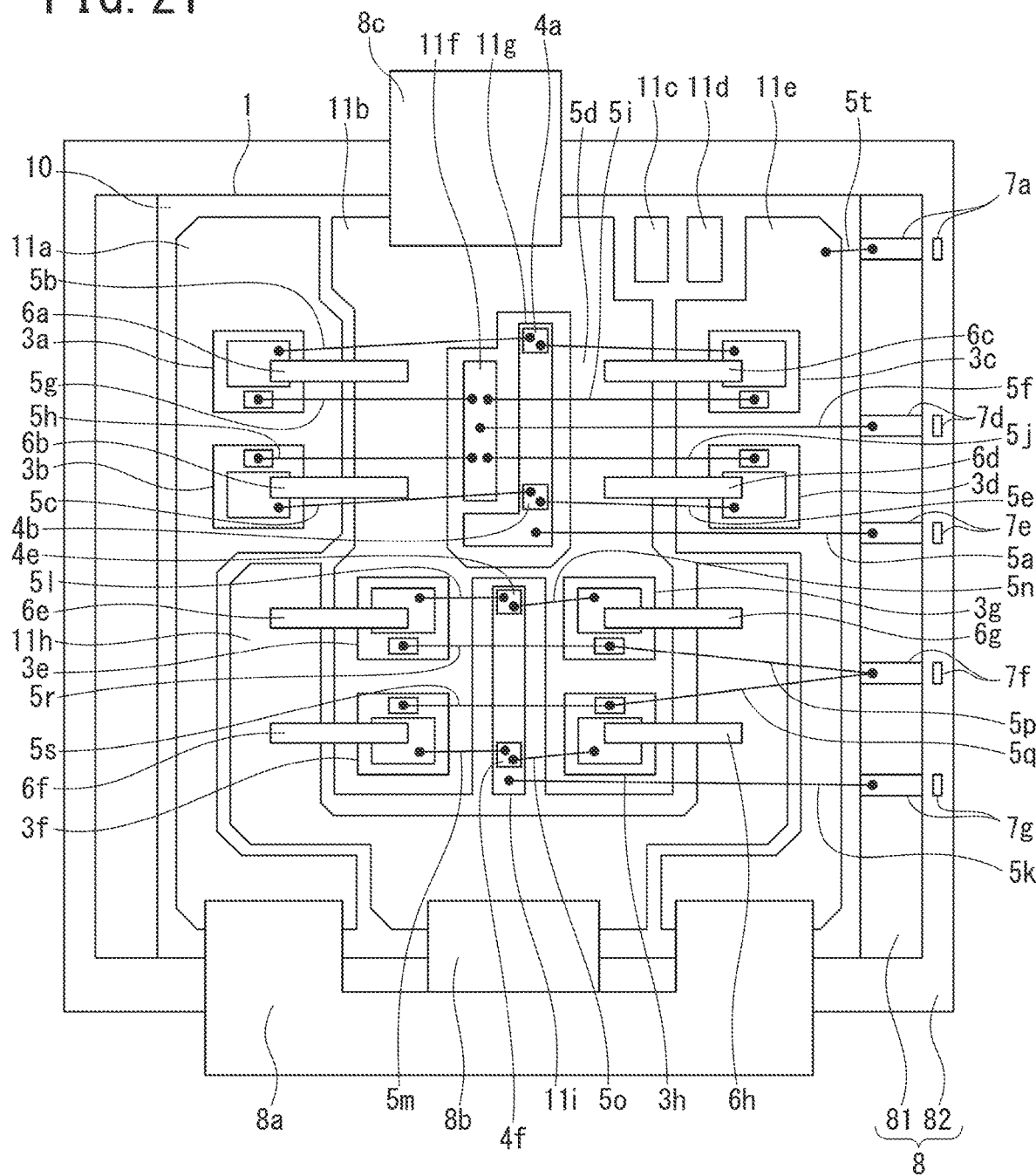
FIG. 21 is a plan view of a semiconductor device according to a second modified example of the second embodiment.

A semiconductor device according to a second modified example of the second embodiment differs from the semiconductor device according to the second embodiment illustrated in FIG. 14 in including the two resistive elements 4a and 4b for the semiconductor elements 3a to 3d and the two resistive elements 4e and 4f for the semiconductor elements 3e to 3h, as illustrated in FIG. 21.

The resistive elements 4a, 4b, 4e, and 4f each have a structure similar to that of the resistive element 4 including the two electrode pads of the top surface electrodes 45e and 45f as illustrated in FIG. 9, for example.

As illustrated in FIG. 21, the resistive elements 4a and 4b are mounted on the upper conductor layer 11g. The bottom surface electrode of the respective resistive elements 4a and 4b is bonded to the top surface of the upper conductor layer 11g via a bonding material such as solder. One of the electrode pads of the two top surface electrodes of the resistive element 4a is connected to the source electrode on the top surface side of the semiconductor element 3a via the bonding wire 5b. The other electrode pad of the resistive element 4a is connected to the source electrode on the top surface side of the semiconductor element 3c via the bonding wire 5i. One of the electrode pads of the two top surface electrodes of the resistive element 4b is connected to the source electrode on the top surface side of the semiconductor element 3b via the bonding wire 5c. The other electrode pad of the resistive element 4b is connected to the source electrode on the top surface side of the semiconductor element 3d via the bonding wire 5e.

The resistive elements 4e and 4f are mounted on the upper conductor layer 11i. The bottom surface electrode of the respective resistive elements 4e and 4f is bonded to the top surface of the upper conductor layer 11i via a bonding material such as solder. One of the electrode pads of the two top surface electrodes of the resistive element 4e is connected to the source electrode on the top surface side of the semiconductor element 3e via the bonding wire 5l. The other electrode pad of the resistive element 4e is connected to the source electrode on the top surface side of the semiconductor element 3g via the bonding wire 5n. One of the electrode pads of the two top surface electrodes of the resistive element 4f is connected to the source electrode on the top surface side of the semiconductor element 3f via the bonding wire 5m. The other electrode pad of the resistive element 4f is connected to the source electrode on the top surface side of the semiconductor element 3h via the bonding wire 5o.

The semiconductor device according to the second modified example of the second embodiment has the configuration in which the resistive elements 4a, 4b, 4e, and 4f each include the two electrode pads of the top surface electrodes, and thus can reduce the number of the resistive elements to four, the resistive elements 4a, 4b, 4e, and 4f, as compared with the semiconductor device according to the second embodiment.

Third Modified Example of Second Embodiment

Figure 22:
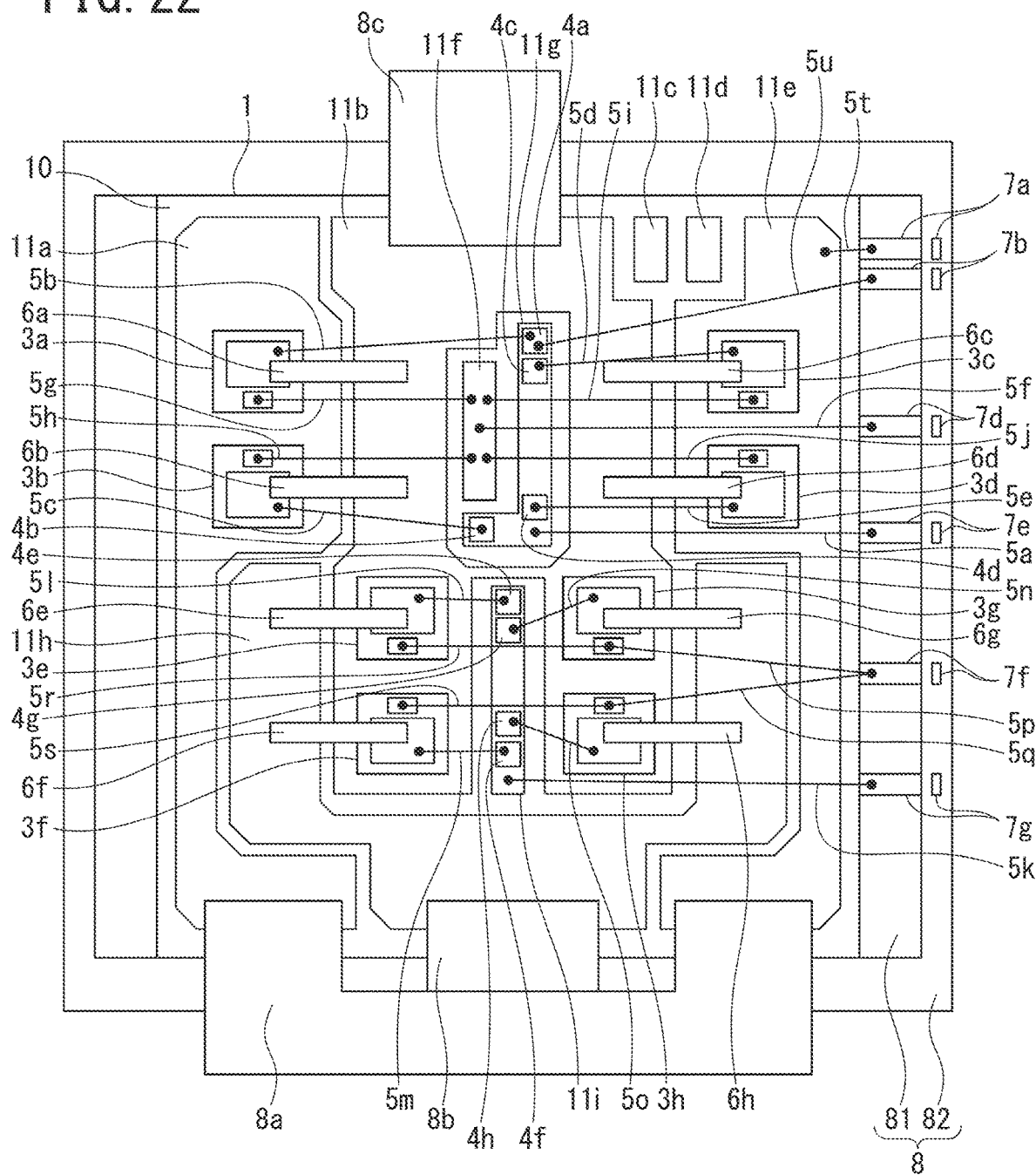
FIG. 22 is a plan view of a semiconductor device according to a third modified example of the second embodiment.

A semiconductor device according to a third modified example of the second embodiment is common to the semiconductor device according to the second embodiment illustrated in FIG. 14 in including the eight resistive elements 4a to 4h, as illustrated in FIG. 22. The semiconductor device according to the third modified example of the second embodiment differs from f the semiconductor device according to the second embodiment illustrated in FIG. 14 in that the resistive element 4a serves as a source resistor of the semiconductor element 3a and also serves as a temperature sensor. The other resistive elements 4b to 4d each only serve as a source resistor of the corresponding semiconductor elements 3b to 3d.

The resistive elements 4a to 4h each have a structure similar to that of the resistive element 4 illustrated in FIG. 4, for example. The electrode pad implemented by the top surface electrode of the resistive element 4a is connected to the source electrode on the top surface side of the semiconductor element 3a via the bonding wire 5b, and is connected to the temperature detection terminal 7b via the bonding wire 5u. The other configurations of the semiconductor device according to the third modified example of the second embodiment are the same as those of the semiconductor device according to the second embodiment, and overlapping explanations are not repeated below.

Figure 23:
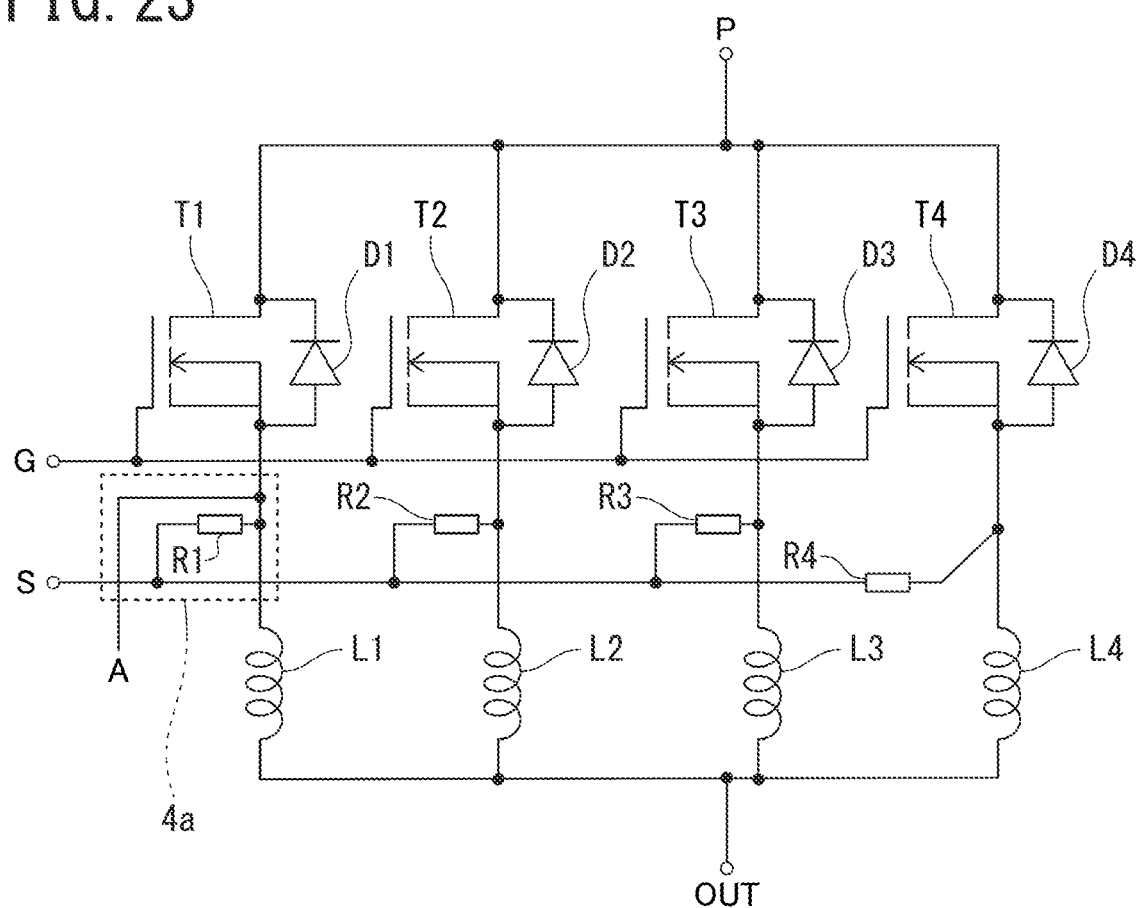
FIG. 23 is a circuit diagram of the semiconductor device according to the third modified example of the second embodiment.

FIG. 23 illustrates an equivalent circuit on the upper arm side implemented by the semiconductor elements 3a to 3d illustrated in FIG. 22. As illustrated in FIG. 23, the resistors (the source resistors) R1 to R4 are connected between the respective source electrodes of the transistors T1 to T4 and the auxiliary source terminal S. A temperature detection terminal A is connected between the source electrode of the transistor T1 and the auxiliary source terminal S. The temperature detection terminal A corresponds to the temperature detection terminal 7b illustrated in FIG. 22.

The semiconductor device according to the third modified example of the second embodiment, which includes the resistive elements 4a to 4h each serving as the source resistor of the corresponding semiconductor elements 3a to 3h, can prevent a loop current from flowing between the auxiliary source and the auxiliary source of the respective semiconductor elements 3a to 3h, so as to prevent the bonding wires from breaking. In addition, the resistive element 4a, which also serves as the temperature sensor, can detect the circumferential temperature around the respective semiconductor elements 3a to 3h.

Fourth Modified Example of Second Embodiment

A semiconductor device according to a fourth modified example of the second embodiment is common to the semiconductor device according to the third modified example of the second embodiment illustrated in FIG. 22 in the planar layout and in that the resistive element 4a serves as the source resistor of the semiconductor element 3a and also serves as the temperature sensor. The semiconductor device according to the fourth modified example of the second embodiment differs from the semiconductor device according to the third modified example of the second embodiment in that the type of the resistive element 4a is different from the type of the other resistive elements 4b to 4h.

The resistive element 4a has a structure similar to that of the resistive element 4 as illustrated in FIG. 11 including the two electrode pads implemented by the two top surface electrodes 45e and 45f and including the resistive layer 43a and the p-n junction diode (43c, 43d) in one chip. As illustrated in FIG. 22, the bottom surface electrode of the resistive element 4a is bonded to the top surface of the upper conductor layer 11g via the bonding material such as solder. One of the electrode pads of the resistive element 4a is connected to the source electrode on the top surface side of the semiconductor element 3a via the bonding wire 5b. The other electrode pad of the resistive element 4a is connected to the temperature detection terminal 7b via the bonding wire 5u.

The resistive elements 4b to 4h each only serve as the source resistor of the corresponding semiconductor elements 3b to 3h. The resistive elements 4b to 4d each have a structure similar to that of the resistive element 4 having the single electrode pad of the top surface electrode 45a as illustrated in FIG. 4, for example.

Figure 24:
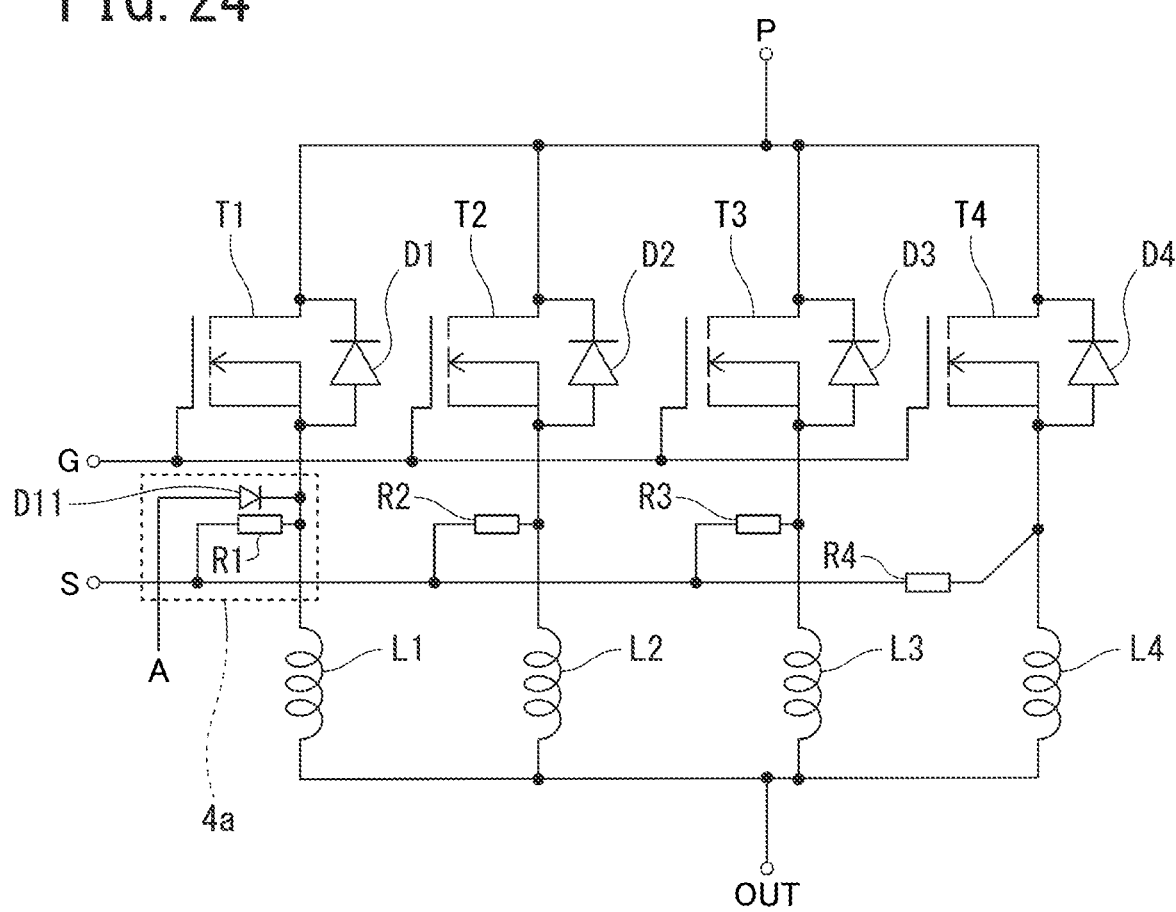
FIG. 24 is a circuit diagram of a semiconductor device according to a fourth modified example of the second embodiment.

FIG. 24 illustrates an equivalent circuit on the upper arm side implemented by the semiconductor elements 3a to 3d of the semiconductor device according the fourth modified example of the second embodiment. As illustrated in FIG. 24, the resistors (the source resistors) R1 to R4 are connected between the respective source electrodes of the transistors T1 to T4 and the auxiliary source terminal S. The resistive element 4a includes the source resistor R1 and the diode D11. The cathode of the diode D11 is connected to the source electrode of the transistor T1. The anode of the diode D11 is connected to the temperature detection terminal A. The temperature detection terminal A corresponds to the temperature detection terminal 7b illustrated in FIG. 22.

The semiconductor device according to the fourth modified example of the second embodiment, in which the resistive elements 4a to 4h each serve as the source resistor of the corresponding semiconductor elements 3a to 3h, can prevent a loop current from flowing between the auxiliary source and the auxiliary source of the respective semiconductor elements 3a to 3h, so as to prevent the bonding wires from breaking. In addition, the resistive element 4a, which also serves as the temperature sensor, can detect the circumferential temperature around the respective semiconductor elements 3a to 3h.

The resistive element 4a may have a structure similar to that of the resistive element 4 as illustrated in FIG. 9 including the two electrode pads of the top surface electrodes 45e and 45f and including the resistive layers 43a and 43b, for example. In this case, the resistive layer 43a serves as the temperature sensor, while the other resistive layer 43b serves as the source resistor, for example. The resistive layer 43a serving as the temperature sensor and the resistive layer 43b serving as the source resistor may be formed in the same step, or may be formed separately in different steps.

Other Embodiments

As described above, the invention has been described according to the first and second embodiments, but it should not be understood that the description and drawings implementing a portion of this disclosure limit the invention. Various alternative embodiments of the present invention, examples, and operational techniques will be apparent to those skilled in the art from this disclosure.

For example, the configurations disclosed in the first and second embodiments may be combined as appropriate within a range that does not contradict with the scope of the respective embodiments. As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
   an insulating circuit substrate;
   a semiconductor element including a first main electrode bonded to a top surface of a first conductor layer of the insulating circuit substrate via a first bonding material, a semiconductor substrate deposited on a top surface of the first main electrode, and a second main electrode deposited on a top surface of the semiconductor substrate; and
   a resistive element including a bottom surface electrode bonded to a top surface of a second conductor layer of the insulating circuit substrate via a second bonding material, a resistive layer with one end electrically connected to the bottom surface electrode, and a first top surface electrode electrically connected to another end of the resistive layer, wherein the first main electrode includes a first bonded layer bonded to the first bonding material, the bottom surface electrode includes a second bonded layer bonded to the second bonding material, and the first bonded layer and the second bonded layer have a common structure.

2. The semiconductor device of claim 1, wherein the semiconductor substrate is made of silicon carbide or silicon.

3. The semiconductor device of claim 1, wherein the resistive element includes a semiconductor substrate made of silicon or silicon carbide.

4. The semiconductor device of claim 1, wherein the first bonded layer and the second bonded layer each include:
a first electrode layer made of gold; and
a second electrode layer deposited on a top surface of the first electrode layer and made of nickel or an alloy mainly including nickel.

5. The semiconductor device of claim 1, wherein the first bonding material and the second bonding material are each solder.

6. The semiconductor device of claim 1, wherein the resistive element is used as a temperature sensor.

7. The semiconductor device of claim 6, wherein:
the first top surface electrode is electrically connected to a first temperature detection terminal; and
the bottom surface electrode is electrically connected to as a second temperature detection terminal.

8. The semiconductor device of claim 6, wherein:
the second main electrode is electrically connected to an auxiliary source terminal;
the first top surface electrode is electrically connected to a temperature detection terminal; and
the bottom surface electrode is electrically connected to the auxiliary source terminal.

9. The semiconductor device of claim 1, wherein the resistive element is used as a source resistor of the semiconductor element.

10. The semiconductor device of claim 9, wherein:
the second main electrode is electrically connected to the first top surface electrode; and
the bottom surface electrode is electrically connected to an auxiliary source terminal.

11. The semiconductor device of claim 1, wherein the resistive element is used as a temperature sensor and is used as a source resistor of the semiconductor element.

12. The semiconductor device of claim 11, wherein the resistive element further includes:
a diode with a cathode electrically connected to the bottom surface electrode; and
a second top surface electrode electrically connected to an anode of the diode.

13. A semiconductor device comprising:
an insulating circuit substrate;
a semiconductor element including a first main electrode bonded to a top surface of a first conductor layer of the insulating circuit substrate via a first bonding material, a semiconductor substrate deposited on a top surface of the first main electrode, and a second main electrode deposited on a top surface of the semiconductor substrate; and
a resistive element including a bottom surface electrode bonded to a top surface of a second conductor layer of the insulating circuit substrate via a second bonding material, a resistive layer with one end electrically connected to the bottom surface electrode, and a first top surface electrode electrically connected to another end of the resistive layer,
wherein the second main electrode is electrically connected to an auxiliary source terminal,
the first top surface electrode is electrically connected to a temperature detection terminal, and
the bottom surface electrode is electrically connected to the auxiliary source terminal.

14. A semiconductor device comprising:
an insulating circuit substrate;
a semiconductor element including a first main electrode bonded to a top surface of a first conductor layer of the insulating circuit substrate via a first bonding material, a semiconductor substrate deposited on a top surface of the first main electrode, and a second main electrode deposited on a top surface of the semiconductor substrate; and
a resistive element including a bottom surface electrode bonded to a top surface of a second conductor layer of the insulating circuit substrate via a second bonding material, a resistive layer with one end electrically connected to the bottom surface electrode, and a first top surface electrode electrically connected to another end of the resistive layer,
wherein the resistive element includes, in one chip, a diode with a cathode or an anode electrically connected to the bottom surface electrode, and a second top surface electrode electrically connected to the anode or the cathode of the diode.

* * * * *